United States Patent
Nakanishi

(10) Patent No.: US 10,754,208 B2
(45) Date of Patent: Aug. 25, 2020

(54) DISPLAY PANEL

(71) Applicant: Sharp Kabushiki Kaisha, Sakai, Osaka (JP)

(72) Inventor: Youhei Nakanishi, Sakai (JP)

(73) Assignee: SHARP KABUSIKI KAISHA, Sakai (JP)

(*) Notice: Subject to any disclaimer, the term of this patent is extended or adjusted under 35 U.S.C. 154(b) by 0 days.

(21) Appl. No.: 16/238,551

(22) Filed: Jan. 3, 2019

(65) Prior Publication Data

US 2019/0140026 A1    May 9, 2019

Related U.S. Application Data

(63) Continuation of application No. PCT/JP2017/024279, filed on Jul. 3, 2017.

(30) Foreign Application Priority Data

Jul. 8, 2016   (JP) .................................. 2016-136024

(51) Int. Cl.
*G02F 1/1335* (2006.01)
*G02F 1/1343* (2006.01)
(Continued)

(52) U.S. Cl.
CPC ...... *G02F 1/134363* (2013.01); *G02F 1/1335* (2013.01); *G02F 1/133512* (2013.01);
(Continued)

(58) Field of Classification Search
CPC ......... G02F 1/133512; G02F 1/134363; G02F 1/134309; G02F 1/136209; G02F 1/1368; G02F 1/1333; G02F 1/1335; G02F 1/133514; G02F 1/133707; G02F 1/134336; G02F 1/1362; G02F 1/1343; G02F 1/13439; G02F 1/1339; G02F 2001/133388; G02F 2001/134345; G02F 2001/134372; G02F 2201/40; G02F 2201/52; G02F 2201/56; G02F 2201/123; G02F 2001/136218; G02F 2001/136222; G09G 2300/0426; G09G 2300/0452; G09G 3/3607; G09G 3/3225; H01L 27/3211; H01L 27/3216; H01L 27/3218; H01L 27/322; H01L 27/3244; H01L 27/3246; H01L 27/326; H01L 27/3272;
(Continued)

(56) References Cited

U.S. PATENT DOCUMENTS

| 2009/0115933 A1 | 5/2009 | Mimura |
| 2016/0120005 A1* | 4/2016 | Wu ........................ H05B 33/22 313/505 |

FOREIGN PATENT DOCUMENTS

| JP | 2008-216357 A | 9/2008 |
| WO | 2007/132574 A1 | 11/2007 |

* cited by examiner

*Primary Examiner* — Thoi V Duong
(74) *Attorney, Agent, or Firm* — Keating & Bennett, LLP

(57) ABSTRACT

To prevent the display quality from being degraded as a result of (i) a boundary portion of an edge region of the display region being visibly in the shape of stairs and/or (ii) emitted light having an unintended color, a display panel includes a light-shielding section including, for each pixel (5) through which a curved boundary line (ideal line) extends, sub-pixel light-shielding sections (3a) each overlapping a corresponding one of a red sub-pixel (4R), a green sub-pixel (4G), and a blue sub-pixel (4B).

11 Claims, 16 Drawing Sheets

(51) Int. Cl.
  *H01L 27/32*    (2006.01)
  *H01L 51/50*    (2006.01)
  *H05B 33/14*    (2006.01)
(52) U.S. Cl.
  CPC ...... *H01L 27/3211* (2013.01); *H01L 27/3216* (2013.01); *H01L 27/3272* (2013.01); *H01L 51/50* (2013.01); *G02F 2001/134345* (2013.01); *G02F 2001/134372* (2013.01); *H01L 27/322* (2013.01); *H05B 33/145* (2013.01)
(58) Field of Classification Search
  CPC ................. H01L 51/5246; H01L 51/50; H01L 27/14621; H01L 27/14623; H01L 51/5284; H05B 33/145
  See application file for complete search history.

DISPLAY PANEL

TECHNICAL FIELD

The disclosure relates to a display panel such as a liquid crystal display panel or an organic EL display panel.

BACKGROUND ART

Recent years have seen a growing demand for a display device having high designability. There has thus been active development of display panels (such as liquid crystal display panels and organic EL display panels) that include a housing with a smooth outer shape and that have a display region whose edge is curved similarly to the outer shape of the housing.

FIG. 13 provides diagrams illustrating (i) an example liquid crystal display panel having a normal, rectangular display region and (ii) an example liquid crystal display panel having a display region in an irregular shape.

(a) of FIG. 13 is a diagram illustrating the shape of the display region of a liquid crystal display panel 100 including a rectangular display region 100a and a mount section 100b. (b) of FIG. 13 is a diagram illustrating the shape of the display region of a liquid crystal display panel 101 including a display region 101a and a mount section 101b, the display region 101a being shaped to have two upper corners that are rounded.

Display panels such as a liquid crystal display panel having a display region in an irregular shape are used as described above for increased designability.

CITATION LIST

Patent Literature

[Patent Literature 1]
WO2007/132574 (International Publication Date: Nov. 22, 2007)
[Patent Literature 2]
Japanese Patent Application Publication, Tokukai, No. 2008-216357 (Publication Date: Sep. 18, 2008)

SUMMARY

Technical Problem

Display panels having a display region in an irregular shape such as a display panel having a display region whose edge is curved involve the following issues: The curved edge region of the display region is visibly in the shape of stairs. Further, an unintended color is displayed. These issues degrade the display quality.

FIG. 14 provides diagrams illustrating a display panel disclosed in Patent Literature 1 above which display panel has a display region with a curved edge.

As illustrated in (a) of FIG. 14, the display panel has a display region 109 including a plurality of rectangular sub-pixels 110, the display region 109 having (i) a linear region covered by a blocking member 105 and (ii) a curved region covered by a light-shielding curved section 111a. The display panel thus has a curved display region.

Specifically, at least a portion of each pseudo curve sub-pixel 112, which is a sub-pixel present at an edge of an upper right region of the display region 109, is covered by a light-shielding curved section 111a. The display panel thus has a curved display region.

The color filter substrate on which the sub-pixels 110, the blocking member 105, and the light-shielding curved section 111a are provided is attached to an active matrix substrate (not shown in the drawing) via a sealing material 104 and a sealing curved section 108.

(b) of FIG. 14 is a partial enlarged diagram of the portion indicated with a dotted line in (a) of FIG. 14. As illustrated in the drawing, each pixel 120 includes three sub-pixels 110 adjacent to one another, namely an R-color sub-pixel 110R, a G-color sub-pixel 110G, and a B-color sub-pixel 110B.

The display panel disclosed in Patent Literature 1 above is configured such that a pixel 120 present at an edge of the upper right region of the display region 109 includes an R-color sub-pixel 110R, a G-color sub-pixel 110G, and a B-color sub-pixel 110B having respective opening areas (that is, the area of a region through which backlight passes) different from one another.

This raises the issue of (i) some pixels each including sub-pixels having respective opening areas different from one another and (ii) such pixels each emitting light having an unintended color and leading to a degraded display quality.

This issue may be alleviated by, in a case where a portion of a pixel 120 is to be covered by a light-shielding curved section 111a, covering that pixel 120 entirely by the light-shielding curved section 111a.

FIG. 15 provides diagrams illustrating a display panel 200 having a display region with a curved edge, which display panel 200 alleviates the issue of pixels at an edge of a display region each emitting light having an unintended color, leading to a degraded display quality.

As illustrated in (a) of FIG. 15, the display panel 200 includes pixels 220 each including an R-color sub-pixel 210R, a G-color sub-pixel 210G, and a B-color sub-pixel 210B that are adjacent to one another and that are separated from one another by a black matrix 230.

The display panel 200 is configured such that in a case where a portion of a pixel 220 is to be covered by a light-shielding section 240, the light-shielding section 240 is formed to entirely cover the R-color sub-pixel 210R, the G-color sub-pixel 210G, and the B-color sub-pixel 210B included in that pixel 220 so that the R-color sub-pixel 210R, the G-color sub-pixel 210G, and the B-color sub-pixel 210B each have no opening area.

This prevents a pixel at an edge of the display region from including sub-pixels having respective opening areas different from one another as in Patent Literature 1 above, and thus alleviates the issue of emitted light having an unintended color and degrading the display quality.

The above configuration, however, unfortunately raises another issue of the display region having an edge in the shape of stairs in the vicinity of an ideal line and thus having an unsmooth edge as illustrated in (b) of FIG. 15.

The ideal line is an ideal boundary line between the light-shielding section 240 and the display region for the following case: As illustrated in (a) of FIG. 15, in a case where a portion of a pixel 220 is to be covered by a light-shielding section 240, the light-shielding section 240 is formed to entirely cover the R-color sub-pixel 210R, the G-color sub-pixel 210G, and the B-color sub-pixel 210B so that the R-color sub-pixel 210R, and the G-color sub-pixel 210G, and the B-color sub-pixel 210B each have no opening area. No consideration is given to whether all the display region consists of rectangular sub-pixels.

FIG. 16 provides diagrams illustrating a display panel disclosed in Patent Literature 2 above which display panel has a display region with a curved edge.

As illustrated in (a), (b), and (c) of FIG. 16, each pixel includes an R-color sub-pixel (R), a G-color sub-pixel (G), and a B-color sub-pixel (B) adjacent to one another. In a case where a portion of a pixel at an edge of the display region is to be covered by a black matrix BM, an adjustment black mask (ABM) was used to adjust the respective opening areas of the R-color sub-pixel (R) and the G-color sub-pixel (G) so that for that pixel, the opening areas are equal to the opening area of the B-color sub-pixel (B), which has the smallest opening area.

This prevents a pixel at an edge of the display region from including sub-pixels having respective opening areas different from one another as in Patent Literature 1 above, and thus alleviates the issue of emitted light having an unintended color and degrading the display quality.

However, in a case where, for instance, the black matrix BM covers almost none of the R-color sub-pixel (R) or the G-color sub-pixel (G) but does cover most of the B-color sub-pixel (B), using an adjustment black mask (ABM) to adjust the respective opening areas of the R-color sub-pixel (R) and the G-color sub-pixel (G) so that the opening areas are equal to the opening area of the B-color sub-pixel (B) (which has the smallest opening area) fails to appropriately utilize the large opening areas of the R-color sub-pixel (R) and the G-color sub-pixel (G) and lets the display region have an edge in the shape of stairs. With the above configuration, it is difficult to satisfactorily alleviate the issue of the display region having an unsmooth edge.

The disclosure has been accomplished in view of the above issues. It is an object of the disclosure to provide a display panel capable of preventing the display quality from being degraded as a result of (i) a boundary portion of an edge region of the display region being visibly in the shape of stairs and/or (ii) emitted light having an unintended color.

Solution to Problem

In order to attain the above object, a display panel in accordance with the disclosure is a display panel, including: a display region in which a plurality of pixels are present each of which includes a first sub-pixel, a second sub-pixel, and a third sub-pixel adjacent to one another; and a light-shielding section shielding at least a portion of an edge region of the display region from light, the light-shielding section including, for each pixel among the plurality of pixels through which pixel a boundary line in a curve between the light-shielding section and a side of a center of the display region extends, sub-pixel light-shielding sections that each overlap a corresponding one of the first sub-pixel, the second sub-pixel, and the third sub-pixel, the sub-pixel light-shielding sections being sized such that a ratio of respective openings of the first sub-pixel, the second sub-pixel, and the third sub-pixel of each pixel among the plurality of pixels through which pixel the boundary line extends is equal to a ratio of respective openings of the first sub-pixel, the second sub-pixel, and the third sub-pixel of each pixel among the plurality of pixels through which pixel the boundary line does not extend and that a ratio of an area of a portion of each pixel among the plurality of pixels through which pixel the boundary line extends at which portion the light-shielding section is absent to an area of said each pixel among the plurality of pixels through which pixel the boundary line extends is equal to a ratio of an area of an opening of one of the first sub-pixel, the second sub-pixel, and the third sub-pixel of each pixel among the plurality of pixels through which pixel the boundary line extends to an area of an opening of a corresponding sub-pixel among the first sub-pixel, the second sub-pixel, and the third sub-pixel of each pixel among the plurality of pixels through which pixel the boundary line does not extend.

With the above configuration, the sub-pixel light-shielding sections, each of which overlaps a corresponding one of the first sub-pixel, the second sub-pixel, and the third sub-pixel adjacent to one another, are sized such that the area ratio of the respective openings (through which light passes) of the first sub-pixel, the second sub-pixel, and the third sub-pixel is equal to the area ratio of the respective openings of the sub-pixels of each pixel through which the boundary line does not extend. Thus, the area ratio of the respective openings (through which light passes) of the first sub-pixel, the second sub-pixel, and the third sub-pixel is not different from the area ratio of the respective openings of the sub-pixels of each pixel through which the boundary line does not extend. This prevents pixels from each emitting light having an unintended color and leading to a degraded display quality.

The sub-pixel light-shielding sections are sized such that a ratio of an area of a portion of each pixel among the plurality of pixels through which pixel the boundary line extends at which portion the light-shielding section is absent to an area of said each pixel among the plurality of pixels through which pixel the boundary line extends is equal to a ratio of an area of an opening of one of the first sub-pixel, the second sub-pixel, and the third sub-pixel of each pixel among the plurality of pixels through which pixel the boundary line extends to an area of an opening of a corresponding sub-pixel among the first sub-pixel, the second sub-pixel, and the third sub-pixel of each pixel among the plurality of pixels through which pixel the boundary line does not extend. This can appropriately reflect the light-transmitting area of each pixel through which the boundary line extends, and can prevent the display region from visibly having an edge in the shape of stairs.

Advantageous Effects of Invention

An aspect of the disclosure provides a display panel capable of preventing the display quality from being degraded as a result of (i) a boundary portion of an edge region of the display region being visibly in the shape of stairs and/or (ii) emitted light having an unintended color.

DESCRIPTION OF EMBODIMENTS

The following description will discuss embodiments of the disclosure with reference to FIGS. 1 to 12. In the description below, a member for an embodiment which member is identical in function to a member described for another embodiment may be assigned the same reference sign and may not be described again for convenience.

Embodiment 1

Figure 1:
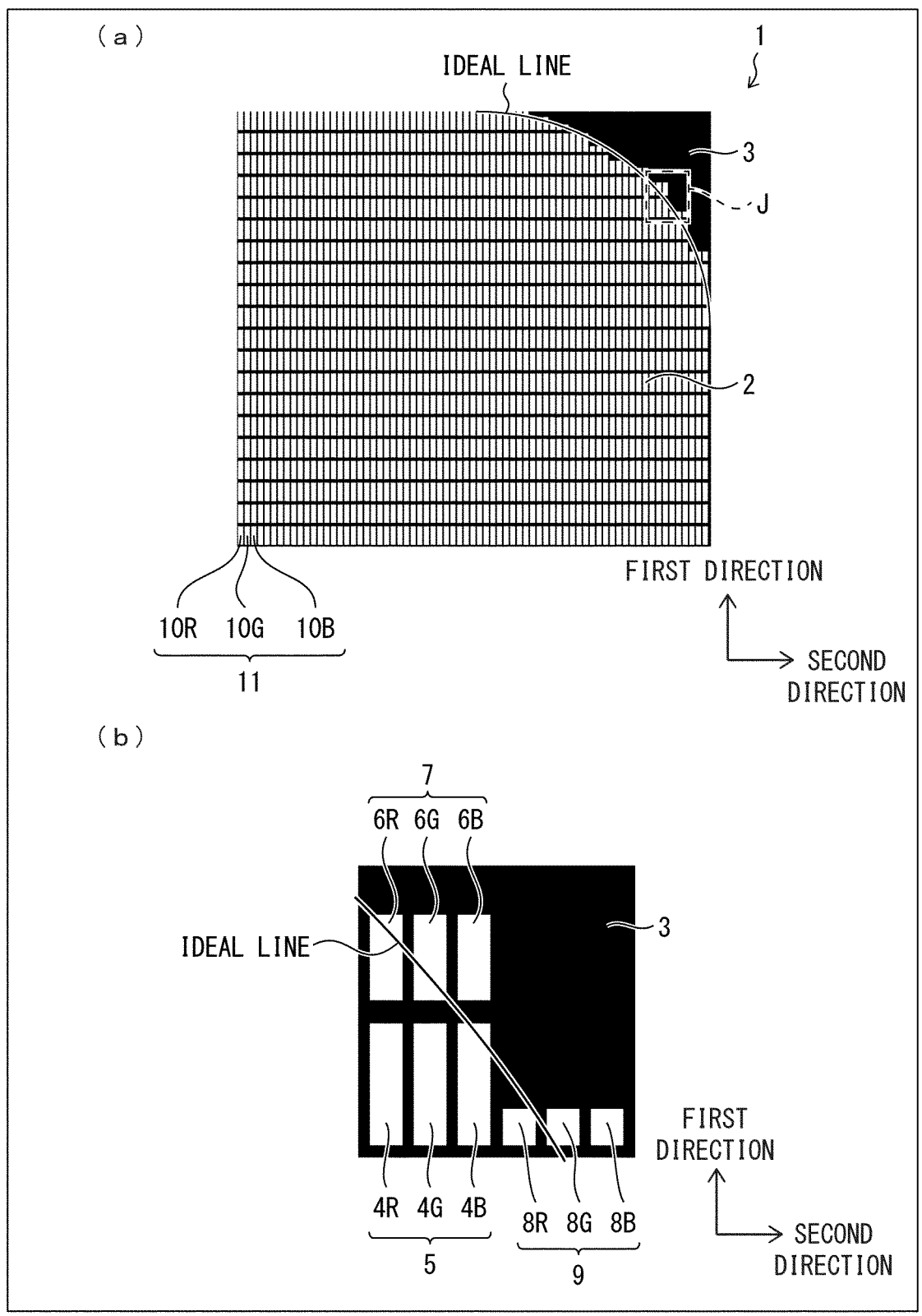
FIG. 1 provides diagrams illustrating a liquid crystal display panel having a display region whose edge region has a portion (that is, an upper right region in the drawing) light-shielded by a light-shielding section.

FIG. 1 provides diagrams illustrating a liquid crystal display panel 1 having a display region 2 whose edge region has a portion (that is, an upper right region in the drawing) light-shielded by a light-shielding section 3.

As illustrated in (a) of FIG. 1, the display region 2 has a plurality of pixels 11, each of which includes (i) a red sub-pixel 10R that allows red light to pass therethrough at a certain transmittance, (ii) a green sub-pixel 10G that allows green light to pass therethrough at a certain transmittance, and (iii) a blue sub-pixel 10B that allows blue light to pass therethrough at a certain transmittance. Each pixel 11 is thus capable of emitting light with an intended color through appropriate adjustment of the respective transmittances of the three colors of light from the red sub-pixel 10R, the green sub-pixel 10G, and the blue sub-pixel 10B.

The present embodiment described here is an example case in which each pixel 11 includes three sub-pixels 10R, 10G, and 10B. The present embodiment is, however, not limited to such a configuration. Each pixel may alternatively include, for example, four sub-pixels as necessary, namely not only a red sub-pixel, a green sub-pixel, and a blue sub-pixel, but also a yellow sub-pixel or a white sub-pixel. Each pixel may further alternatively include, for example, five sub-pixels, namely a red sub-pixel, a green sub-pixel, a blue sub-pixel, a yellow sub-pixel, and a cyan sub-pixel. Each pixel may further alternatively include, as necessary, six or more sub-pixels having respective colors different from one another.

The present embodiment described here is an example case in which each pixel 11 includes three equally-sized sub-pixels 10R, 10G, and 10B. The present embodiment is, however, not limited to such a configuration. Each pixel may alternatively include, as necessary, a plurality of sub-pixels having respective sizes different from one another.

(a) of FIG. 1 shows an ideal line, which is an ideal boundary line between a light-shielding section 3 and a display region 2 for a case where the display region 2 has an edge region with a portion hidden by the light-shielding section 3 along a curve, the ideal line having been drawing not in view of the fact that each pixel 11 through which the ideal line extends will have a red sub-pixel 10R, a green sub-pixel 10G, and a blue sub-pixel 10B having respective opening areas different from one another.

In a case where a light-shielding section 3 has been formed to have a boundary line on the above ideal line, each pixel 11 including sub-pixels 10R, 10G, and 10B having respective opening areas different from one another emits light having an unintended color, leading to the issue of a degraded display quality.

The term "opening area" is defined as an area through which backlight passes.

Each red sub-pixel 10R (first sub-pixel) shown in (a) of FIG. 1 includes a transparent electrode connected to the drain electrode of the corresponding one of thin-film transistor elements (hereinafter referred to as TFT elements) provided for the respective sub-pixels, and also includes a lower alignment film on the transparent electrode, a liquid crystal layer, an upper alignment film, a common transparent electrode, and a red color filter region that does not coincide with a black matrix layer (BM layer) in a plan view.

Each green sub-pixel 10G (second sub-pixel) shown in (a) of FIG. 1 includes a transparent electrode connected to the drain electrode of the corresponding one of the TFT elements provided for the respective sub-pixels, and also includes a lower alignment film on the transparent electrode, a liquid crystal layer, an upper alignment film, a common transparent electrode, and a green color filter region that does not coincide with a black matrix layer (BM layer) in a plan view.

Each blue sub-pixel 10B (third sub-pixel) shown in (a) of FIG. 1 includes a transparent electrode connected to the drain electrode of the corresponding one of the TFT elements provided for the respective sub-pixels, and also includes a lower alignment film on the transparent electrode, a liquid crystal layer, an upper alignment film, a common transparent electrode, and a blue color filter region that does not coincide with a black matrix layer (BM layer) in a plan view.

With the above configuration, appropriately adjusting the voltage to be applied to the source electrode of the TFT element provided for each sub-pixel can adjust the orientation of liquid crystal molecules in the liquid crystal layer and thereby adjust the transmittance of light from the side of a backlight device for the sub-pixel.

In order to prevent the above issue (that is, in the case where a light-shielding section 3 has been formed to have a boundary line on the ideal line shown in FIG. 1, some pixels each emit light having an unintended color, leading to a degraded display quality), the liquid crystal display panel 1 is configured as illustrated in (b) of FIG. 1 (which is a partial enlarged diagram of the portion indicated with "J" in (a) of FIG. 1) such that for pixels through which an ideal line as a curved boundary line extends (such as the pixel 5, the pixel 7, and the pixel 9), the light-shielding section 3 having the boundary line (ideal line) includes sub-pixel light-shielding sections 3*a* and 3*b* (see FIG. 2), with the result of the pixel 5, the pixel 7, and the pixel 9 being as illustrated in (b) of FIG. 1.

In other words, the liquid crystal display panel 1 does not include a light-shielding section 3 having an ideal line as a curved boundary line, but includes sub-pixel light-shielding sections 3*a* and 3*b* (see FIG. 2) for pixels through which an ideal line as a curved boundary line extends (such as the pixel 5, the pixel 7, and the pixel 9), such pixels being each shaped differently from pixels 11 through which an ideal line as a curved boundary line does not extend.

Specifically, since the liquid crystal display panel 1 includes sub-pixel light-shielding sections 3*a* and 3*b* (see FIG. 2) for pixels through which an ideal line as a curved boundary line extends (such as the pixel 5, the pixel 7, and the pixel 9), such pixels are each shaped to have an opening area smaller than that of each pixel 11. The sub-pixels 4R, 4G, and 4B included in the pixel 5, the sub-pixels 6R, 6G, and 6B included in the pixel 7, and the sub-pixels 8R, 8G, and 8B included in the pixel 9 are all shaped to have an opening area smaller than that of each of the sub-pixels 10R, 10G, and 10B included in each pixel 11.

Figure 2:
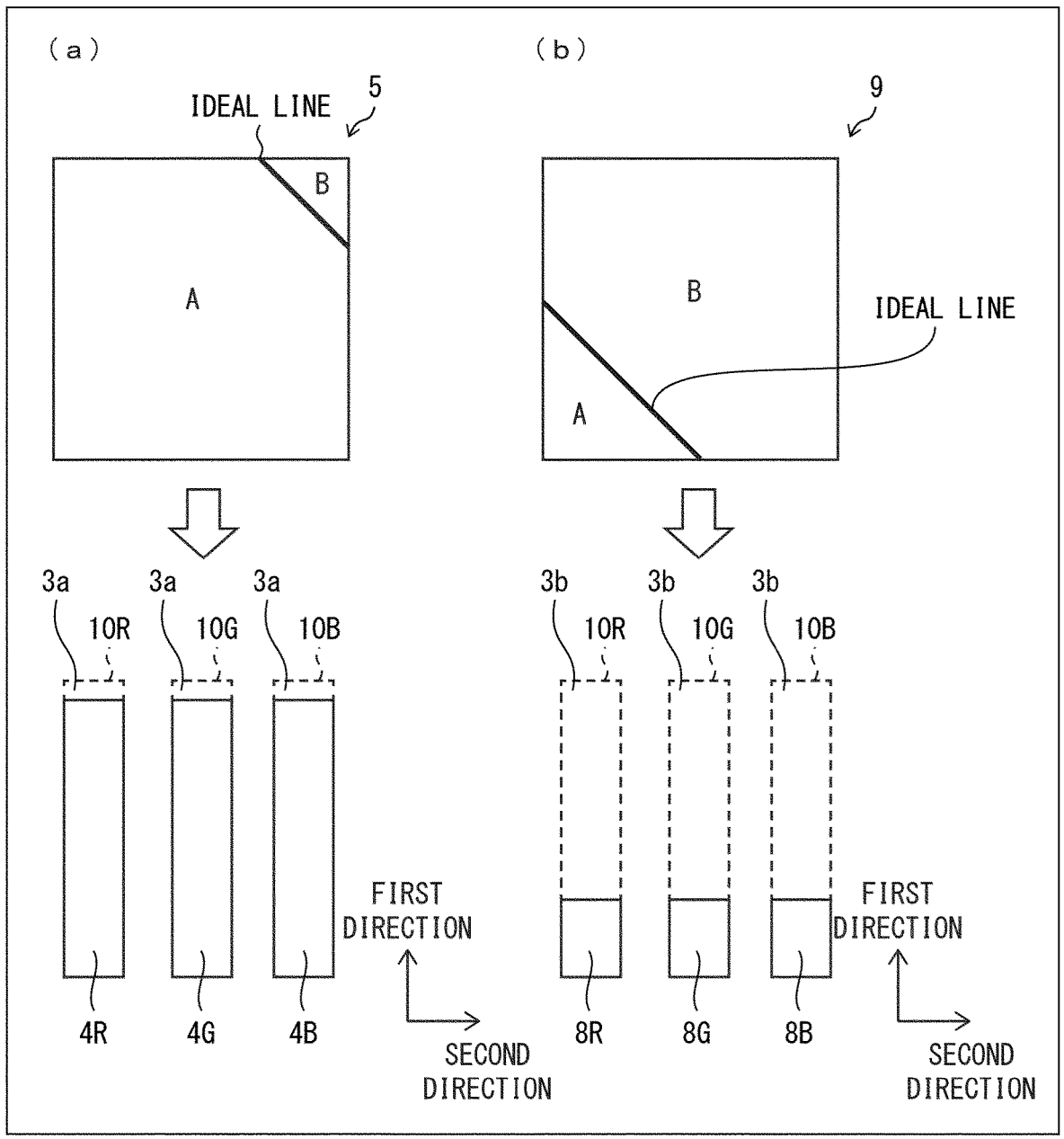
FIG. 2 provides diagrams illustrating how sub-pixel light-shielding sections are sized for pixels through which an ideal line as a curved boundary line extends.

FIG. 2 provides diagrams illustrating how sub-pixel light-shielding sections 3*a* and 3*b* are sized for pixels through which an ideal line as a curved boundary line extends.

(a) of FIG. 2 illustrates a case where an ideal line as a curved boundary line extends through an upper right portion of the pixel 5. In such a case, the pixel 5 can be divided by the boundary line into a region A (A) and a region B (B).

The region B (B) would be entirely covered by a light-shielding section 3 having the boundary line (ideal line). No light from the side of a backlight device would pass through the region B (B) of the pixel 5.

The region A (A) would not be covered by a light-shielding section 3 having the boundary line (ideal line). Light from the side of a backlight device would pass through each sub-pixel portion in the region A (A) in which sub-pixel portion no black matrix layer is present and which sub-pixel portion is an opening.

As described above, the opening area of the pixel 5 is determined by the size of each sub-pixel portion in the region A (A) in which sub-pixel portion no black matrix layer is present and which sub-pixel portion is an opening.

The liquid crystal display panel 1 includes sub-pixel light-shielding sections 3*a* each with a predetermined size for the pixel 5 (through which an ideal line as a curved boundary line extends).

As illustrated in (a) of FIG. 2, the liquid crystal display panel 1 includes for each sub-pixel a sub-pixel light-shielding section 3*a* having a predetermined size such that the opening area of each of the sub-pixels 4R, 4G, and 4B included in the pixel 5 and the opening area of each of the sub-pixels 10R, 10G, and 10B through which the ideal line does not extend have a ratio (for example, the ratio of the opening area of the sub-pixel 4R to the opening area of the sub-pixel 10R) equal to, for example, the ratio of the area of the region A (A) to the area of the entire pixel 5 or the area of each pixel through which the ideal line does not extend (that is, the ratio of the area of the region A to the sum of the area of the region A and the area of the region B).

The liquid crystal display panel 1 is configured, in order to prevent the issue of (i) some pixels each including sub-pixels having an opening area ratio different from the opening area ratio of the sub-pixels included in each pixel through which the ideal line does not extend and (ii) such pixels each emitting light having an unintended color and leading to a degraded display quality, such that the pixel 5 includes sub-pixels 4R, 4G, and 4B having respective opening areas at a ratio equal to the ratio of the respective areas of the sub-pixels included in each pixel through which the ideal line does not extend.

The sub-pixels 4R, 4G, and 4B included in the pixel 5 each have an opening area smaller, in correspondence with a sub-pixel light-shielding section 3*a*, than that of each of the sub-pixels 10R, 10G, and 10B included in each pixel 11 through which an ideal line as a curved boundary line does not extend.

(b) of FIG. 2 illustrates a case where an ideal line as a curved boundary line extends through a lower left portion of the pixel 9. In such a case, the pixel 9 can be divided by the boundary line as the center into a region A (A) and a region B (B).

The region B (B) would be entirely covered by a light-shielding section 3 having the boundary line (ideal line). No light from the side of a backlight device would pass through the region B (B) of the pixel 9.

The region A (A) would not be covered by a light-shielding section 3 having the boundary line (ideal line). Light from the side of a backlight device would pass through each sub-pixel portion in the region A (A) in which sub-pixel portion no black matrix layer is present and which sub-pixel portion is an opening.

As described above, the opening area of the pixel 9 is determined by the size of each sub-pixel portion in the region A (A) in which sub-pixel portion no black matrix layer is present and which sub-pixel portion is an opening.

The liquid crystal display panel 1 includes sub-pixel light-shielding sections 3*b* each with a predetermined size for the pixel 9 (through which an ideal line as a curved boundary line extends).

As illustrated in (b) of FIG. 2, the liquid crystal display panel 1 includes for each sub-pixel a sub-pixel light-shielding section 3*b* having a predetermined size such that the opening area of each of the sub-pixels 8R, 8G, and 8B included in the pixel 9 and the opening area of each of the sub-pixels 10R, 10G, and 10B through which the ideal line does not extend have a ratio (for example, the ratio of the opening area of the sub-pixel 8R to the opening area of the sub-pixel 10R) equal to, for example, the ratio of the area of the region A (A) to the area of the entire pixel 9 or the area of each pixel through which the ideal line does not extend (that is, the ratio of the area of the region A to the sum of the area of the region A and the area of the region B).

The liquid crystal display panel 1 is configured, in order to prevent the issue of (i) some pixels each including sub-pixels having respective opening areas different from one another and (ii) such pixels each emitting light having an unintended color and leading to a degraded display quality, such that the pixel 9 includes sub-pixels 8R, 8G, and 8B having respective opening areas at a ratio equal to the ratio of the respective opening areas of the sub-pixels included in each pixel through which the ideal line does not extend.

The sub-pixels 8R, 8G, and 8B included in the pixel 9 each have an opening area smaller, in correspondence with a sub-pixel light-shielding section 3b, than that of each of the sub-pixels 10R, 10G, and 10B included in each pixel 11 through which an ideal line as a curved boundary line does not extend.

As described above, the liquid crystal display panel 1 includes sub-pixel light-shielding sections 3a and 3b sized such that (i) both the respective openings of the sub-pixels 4R, 4G, and 4B and the respective openings of the sub-pixels 8R, 8G, and 8B have an area ratio equal to the area ratio of the respective openings of the sub-pixels 10R, 10G, and 10B of each pixel through which an ideal line as a curved boundary line does not extend and that (ii) the area of a portion of each of the pixels 5 and 9 (through which the ideal line extends) at which portion the light-shielding section 3 is absent (that is, the area of the region A in FIG. 2) and the area of each of the pixels 5 and 9 (that is, the sum of the area of the region A and the area of the region B in FIG. 2) have a ratio equal to the ratio of the area of the opening of one of the sub-pixels 4R, 4G, and 4B of the pixel 5 (through which the ideal line extends) or the sub-pixels 8R, 8G, and 8B of the pixel 9 (through which the ideal line extends) to the area of the opening of the corresponding one of the sub-pixels 10R, 10G, and 10B of each pixel 11 through which the ideal line does not extend.

The liquid crystal display panel 1 is configured, as illustrated in FIG. 2, such that for the pixels 5 and 9 (through which an ideal line as a curved boundary line extends), only the length (that is, the dimension in the up-down direction in FIG. 2) of the opening of each of the sub-pixels 4R, 4G, 4B, 8R, 8G, and 8B is adjusted while the width in the longitudinal direction (first direction) of each of the sub-pixels 4R, 4G, 4B, 8R, 8G, and 8B, that is, the width (second direction; the dimension in the left-right direction in FIG. 2) orthogonal to the longitudinal direction (first direction), is kept unchanged.

The opening of a sub-pixel is a portion of the sub-pixel at which portion no black matrix layer or sub-pixel light-shielding section is present and through which portion backlight passes.

The present embodiment described here is an example case in which (i) each pixel 11 includes three equally-sized sub-pixels 10R, 10G, and 10B having an equal opening area, the ratio of the opening areas being 1:1:1, (ii) the pixel 5 (as an example pixel through which an ideal line as a curved boundary line extends) includes sub-pixels 4R, 4G, and 4B having respective opening areas at a ratio of 1:1:1, and (iii) the pixel 9 (as an example pixel through which an ideal line as a curved boundary line extends) includes sub-pixels 8R, 8G, and 8B having respective opening areas at a ratio of 1:1:1. The present embodiment is, however, not limited to such a configuration. The liquid crystal display panel 1 may include sub-pixel light-shielding sections 3a and 3b such that in a case where each pixel 11 includes three differently-sized sub-pixels 10R, 10G, and 10B having respective opening areas at a ratio of 2:1.5:1, the pixel 5 (as an example pixel through which an ideal line as a curved boundary line extends) includes sub-pixels 4R, 4G, and 4B having respective opening areas at a ratio of 2:1.5:1, and the pixel 9 (as an example pixel through which an ideal line as a curved boundary line extends) includes sub-pixels 8R, 8G, and 8B having respective opening areas at a ratio of 2:1.5:1.

The liquid crystal display panel 1 is of the TN mode (that is, no sub-pixel is divided in a particular direction). Including sub-pixel light-shielding sections 3a and 3b in such a manner as to, for the pixels 5 and 9 (through which an ideal line as a curved boundary line extends), simply adjust only the dimension in the longitudinal direction (first direction), that is, the length in the up-down direction of the drawing, of the opening of each of the sub-pixels 4R, 4G, 4B, 8R, 8G, and 8B can change the opening area without degrading the visual angle property of the liquid crystal display panel 1.

The above description shows that in the case where sub-pixel light-shielding sections 3a and 3b are included in such a manner as to, for the pixels 5 and 9 (through which an ideal line as a curved boundary line extends), simply adjust only the dimension in the longitudinal direction (first direction), that is, the length in the up-down direction of the drawing, of the opening of each of the sub-pixels 4R, 4G, 4B, 8R, 8G, and 8B, a liquid crystal display panel of the TN mode may be used suitably. The liquid crystal display panel is, however, not limited to a liquid crystal display panel of the TN mode, and may suitably be of any of various modes described below.

Figure 3:
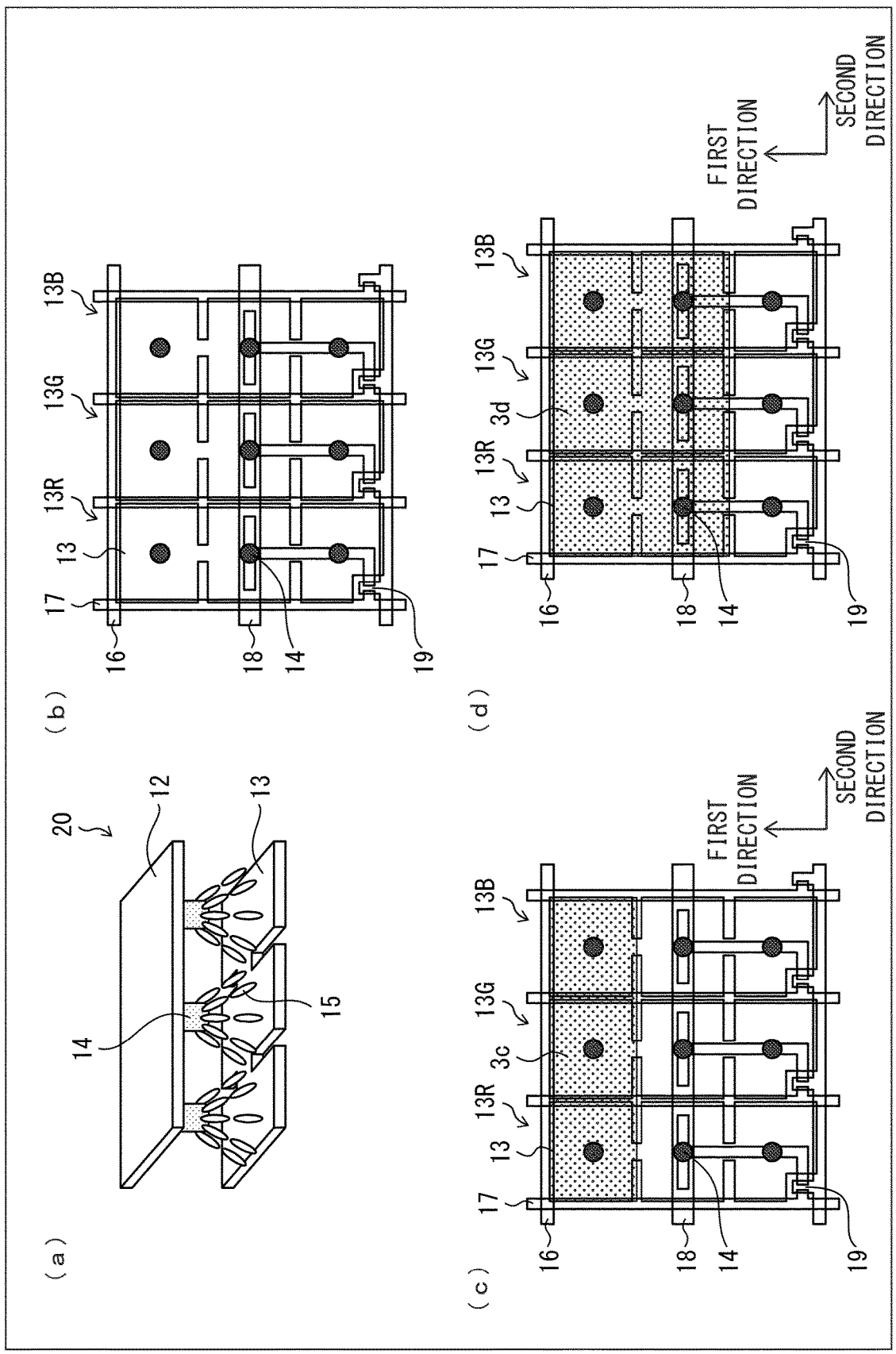
FIG. 3 provides diagrams illustrating a liquid crystal display panel of the CPA mode including rivets.

FIG. 3 provides diagrams illustrating a liquid crystal display panel 20 of the continuous pinwheel alignment (CPA) mode including rivets 14 which liquid crystal display panel 20 is suitably usable for a case where sub-pixel light-shielding sections 3c or 3d are included in such a manner as to, for each pixel through which an ideal line as a curved boundary line extends, adjust only the dimension in the longitudinal direction (first direction), that is, the length in the up-down direction of the drawing, of the opening of each of sub-pixels 13R, 13G, and 13B.

(a) of FIG. 3 is a diagram schematically illustrating the configuration of the liquid crystal display panel 20. The liquid crystal display panel 20 includes an upper electrode 12 and a lower electrode 13, the upper electrode 12 being provided with rivets 14 protruding vertically in the liquid crystal layer containing liquid crystal molecules 15, the rivets 14 serving as an orientation aligner for the liquid crystal molecules 15.

(b) of FIG. 3 is a diagram schematically illustrating the configuration of a TFT substrate for which the lower electrode 13 of the liquid crystal display panel 20 are provided.

As illustrated in the drawing, the TFT substrate is provided with, in a layer below the lower electrode 13, a gate line 16, a source line 17, a storage capacitor line 18, and a gate line 19.

As illustrated in (c) and (d) of FIG. 3, in a case where (i) sub-pixel light-shielding sections 3c or 3d are included in such a manner as to, for each pixel through which an ideal line as a curved boundary line extends, simply adjust only the dimension in the longitudinal direction (first direction), that is, the length in the up-down direction of the drawing, of the opening of each of the sub-pixels 13R, 13G, and 13B and (ii) the sub-pixel light-shielding sections 3c or 3d are extended for each divisional region (for which liquid crystal molecules 15 are regulated with use of a single rivet 14), the liquid crystal display panel 20 of the CPA mode is configured such that applying a voltage to the liquid crystal layer causes the liquid crystal molecules 15 to be oriented radially, thereby making it possible to change the opening area without degrading the visual angle property of the liquid crystal display panel 20.

In a case where (i) a liquid crystal display panel of the CPA mode includes pixels each including, for example, a red sub-pixel, a green sub-pixel, a blue sub-pixel, and a white sub-pixel and (ii) the four sub-pixels are not arranged next to each other in the second direction shown in the drawing but are arranged in a two-by-two matrix, the opening of each sub-pixel needs to be adjusted not only in the up-down direction (length) as described above, but also in, for example, the left-right direction (width) as described later for Embodiment 2.

Figure 4:
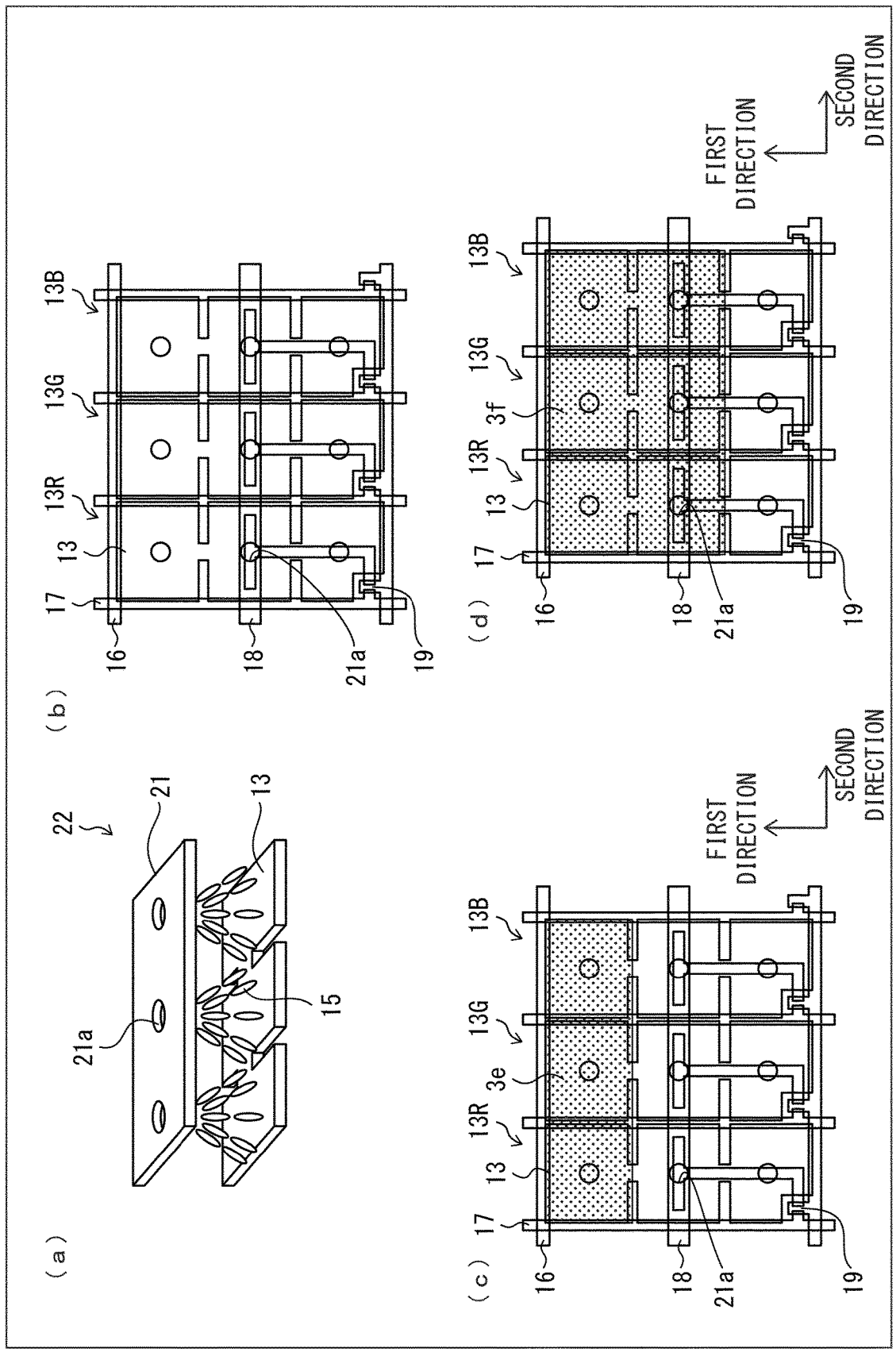
FIG. 4 provides diagrams illustrating a liquid crystal display panel of the CPA mode including an upper electrode with holes.

FIG. 4 provides diagrams illustrating a liquid crystal display panel 22 of the CPA mode including an upper electrode 21 with holes 21a which liquid crystal display panel 22 is suitably usable for a case where sub-pixel light-shielding sections 3e or 3f are included in such a manner as to, for each pixel through which an ideal line as a curved boundary line extends, adjust only the dimension in the longitudinal direction (first direction), that is, the length in the up-down direction of the drawing, of the opening of each of sub-pixels 13R, 13G, and 13B.

(a) of FIG. 4 is a diagram schematically illustrating the configuration of the liquid crystal display panel 22. The liquid crystal display panel 22 includes an upper electrode 21 and a lower electrode 13, the upper electrode 21 having holes 21a as an orientation aligner for the liquid crystal molecules 15.

(b) of FIG. 4 is a diagram schematically illustrating the configuration of a TFT substrate for which the lower electrode 13 of the liquid crystal display panel 22 are provided.

As illustrated in the drawing, the TFT substrate is provided with, in a layer below the lower electrode 13, a gate line 16, a source line 17, a storage capacitor line 18, and a gate line 19.

As illustrated in (c) and (d) of FIG. 4, in a case where (i) sub-pixel light-shielding sections 3e or 3f are included in such a manner as to, for each pixel through which an ideal line as a curved boundary line extends, simply adjust only the dimension in the longitudinal direction (first direction), that is, the length in the up-down direction of the drawing, of the opening of each of the sub-pixels 13R, 13G, and 13B and (ii) the sub-pixel light-shielding sections 3e or 3f are extended for each divisional region (for which liquid crystal molecules 15 are regulated with use of a single hole 21a), the liquid crystal display panel 22 of the CPA mode is configured such that applying a voltage to the liquid crystal layer causes the liquid crystal molecules 15 to be oriented radially, thereby making it possible to change the opening area without degrading the visual angle property of the liquid crystal display panel 22.

As described above, in a case where (i) a liquid crystal display panel of the CPA mode includes pixels each including, for example, a red sub-pixel, a green sub-pixel, a blue sub-pixel, and a white sub-pixel and (ii) the four sub-pixels are not arranged next to each other in the second direction shown in the drawing but are arranged in a two-by-two matrix, the opening of each sub-pixel needs to be adjusted not only in the up-down direction (length) as described above, but also in, for example, the left-right direction (width) as described later for Embodiment 2.

Figure 5:
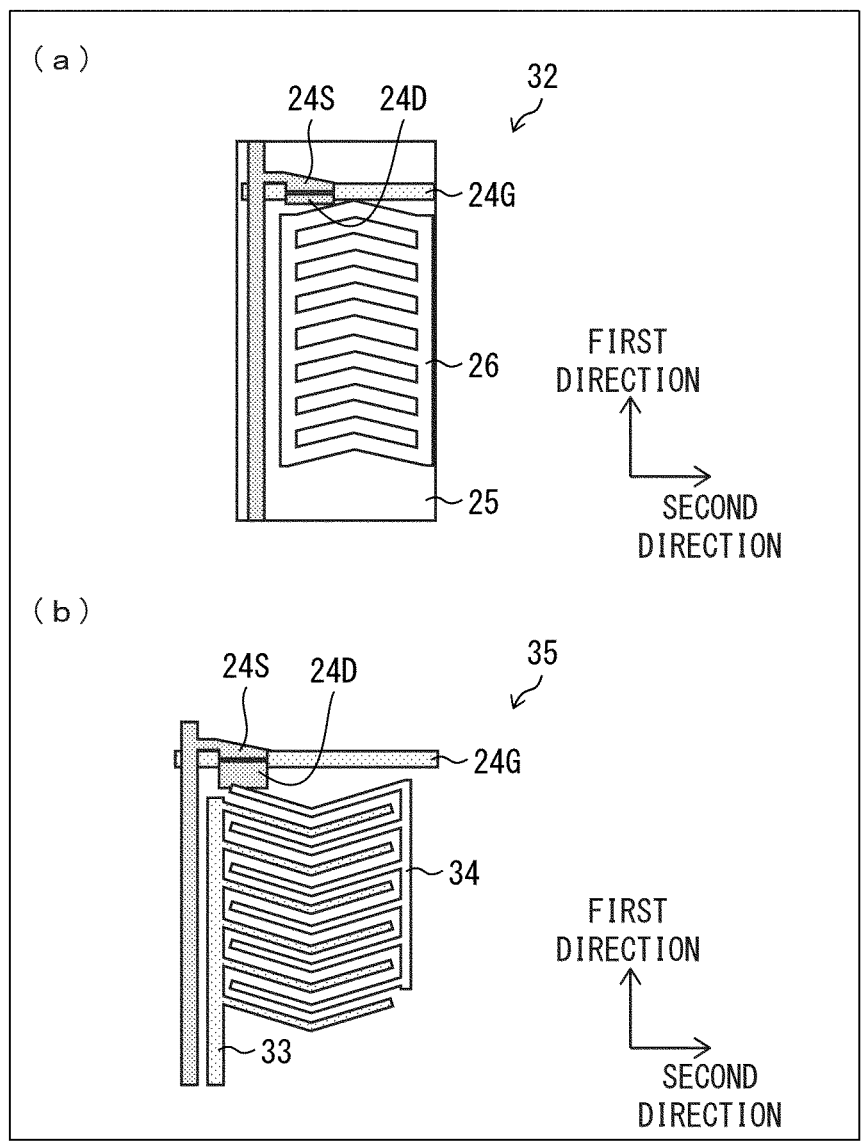
FIG. 5 provides diagrams illustrating a liquid crystal display panel of the FFS mode and a liquid crystal display panel of the IPS mode each having an electrode structure with which liquid crystal molecules are divided into two halves in the left-right direction of the drawing.

FIG. 5 provides diagrams illustrating a liquid crystal display panel 32 of the fringe field switching (FFS) mode and a liquid crystal display panel 35 of the in-plane switching (IPS) mode each having an electrode structure with which liquid crystal molecules are divided into two halves in the left-right direction of the drawing.

(a) of FIG. 5 is a diagram schematically illustrating the configuration of a sub-pixel of the liquid crystal display panel 32 of the FFS mode (which has an electrode structure with which liquid crystal molecules are divided into two halves in the left-right direction of the drawing). As illustrated in the drawing, each sub-pixel of the liquid crystal display panel 32 of the FFS mode has a TFT element. The liquid crystal display panel 32 of the FFS mode has a lower substrate provided with (i) a gate line including a gate electrode 24G, (ii) a source line including a source electrode 24S, (iii) a drain electrode 24D, (iv) a common electrode 25, and (v) a pixel electrode 26 connected to the drain electrode 24D. The source electrode 24S, the drain electrode 24D, and the source line belong to an identical layer. The drain electrode 24D and the source line including the source electrode 24S are apart from each other.

The liquid crystal display panel 32 of the FFS mode includes sub-pixels in each of which liquid crystal molecules are divided into two halves in the left-right direction of the drawing due to the respective shapes of the common electrode 25 and the pixel electrode 26.

The liquid crystal display panel 32 of the FFS mode includes sub-pixel light-shielding sections in such a manner as to, for each pixel through which an ideal line as a curved boundary line extends, simply adjust only the dimension in the longitudinal direction (first direction), that is, the length in the up-down direction of the drawing, of the opening of each sub-pixel, and can thereby change the opening area without degrading the visual angle property of the liquid crystal display panel 32 of the FFS mode.

(b) of FIG. 5 is a diagram schematically illustrating the configuration of a sub-pixel of the liquid crystal display panel 35 of the IPS mode (which has an electrode structure with which liquid crystal molecules are divided into two halves in the left-right direction of the drawing). As illustrated in the drawing, each sub-pixel of the liquid crystal display panel 35 of the IPS mode has a TFT element. The liquid crystal display panel 35 of the IPS mode has a lower substrate provided with (i) a gate line including a gate electrode 24G, (ii) a source line including a source electrode 24S, (iii) a drain electrode 24D, (iv) a common electrode 33, and (v) a pixel electrode 34 connected to the drain electrode 24D. The source electrode 24S, the drain electrode 24D, and the source line belong to an identical layer. The drain electrode 24D and the source line including the source electrode 24S are apart from each other.

The liquid crystal display panel 35 of the IPS mode includes sub-pixels in each of which liquid crystal molecules are divided into two halves in the left-right direction of the drawing due to the respective shapes of the common electrode 33 and the pixel electrode 34.

The liquid crystal display panel 35 of the IPS mode includes sub-pixel light-shielding sections in such a manner as to, for each pixel through which an ideal line as a curved boundary line extends, simply adjust only the dimension in the longitudinal direction (first direction), that is, the length in the up-down direction of the drawing, of the opening of each sub-pixel, and can thereby change the opening area without degrading the visual angle property of the liquid crystal display panel 35 of the IPS mode.

The sub-pixel light-shielding sections 3a, 3b, 3c, 3d, 3e, and 3f may be defined by (i) a black matrix layer provided on the side of a color filter substrate or (ii) another light-blocking layer on the side of the TFT substrate or the side of the color filter substrate. For the present embodiment, when a black matrix layer to be provided on the side of the color filter substrate was formed into a pattern, the respective patterns of the sub-pixel light-shielding sections 3a, 3b, 3c, 3d, 3e, and 3f are also formed for reduced production steps.

Embodiment 2

Figure 6:
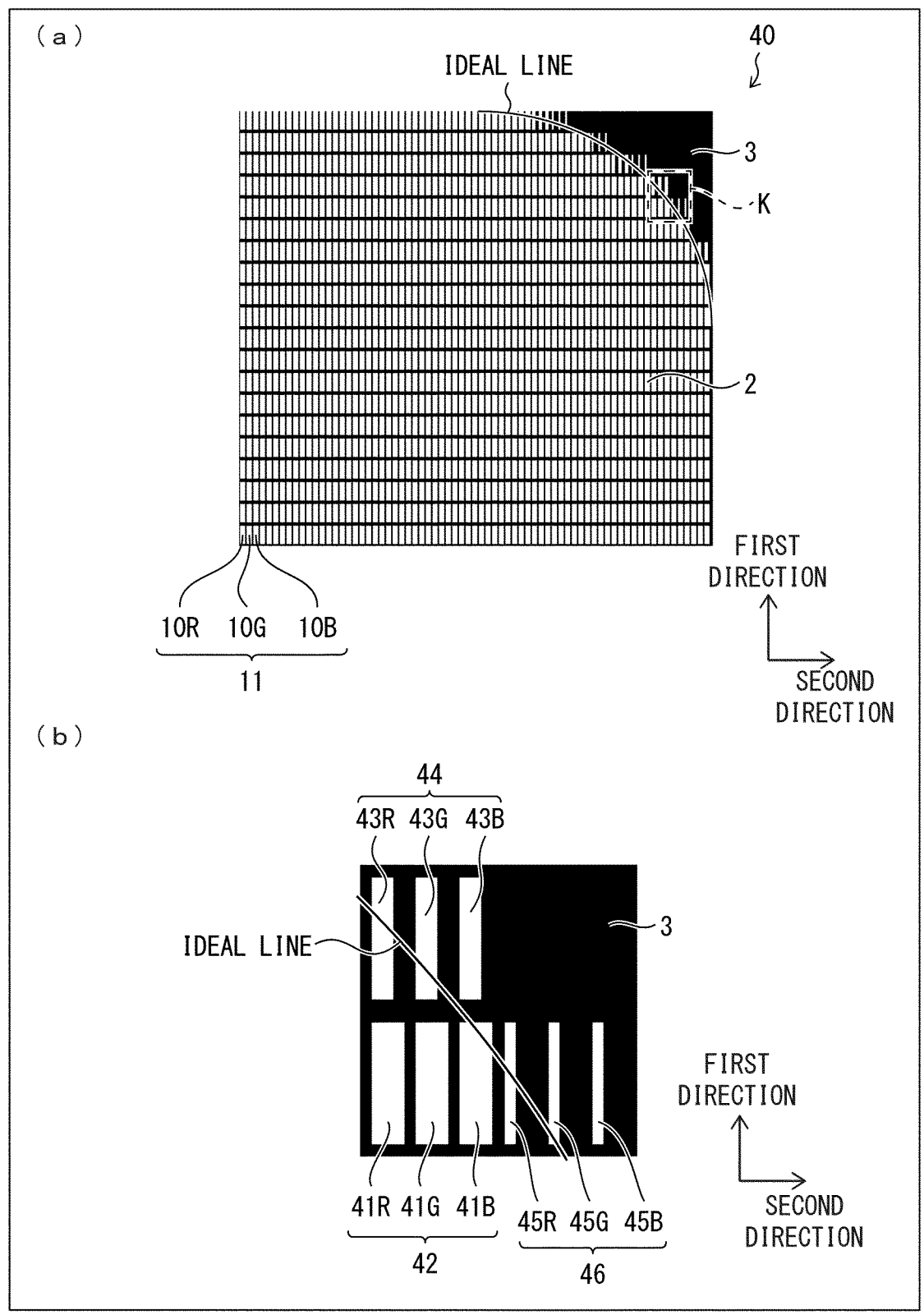
FIG. 6 provides diagrams illustrating another liquid crystal display panel having a display region whose edge region has a portion (that is, an upper right region in the drawing) light-shielded by a light-shielding section.
Figure 7:
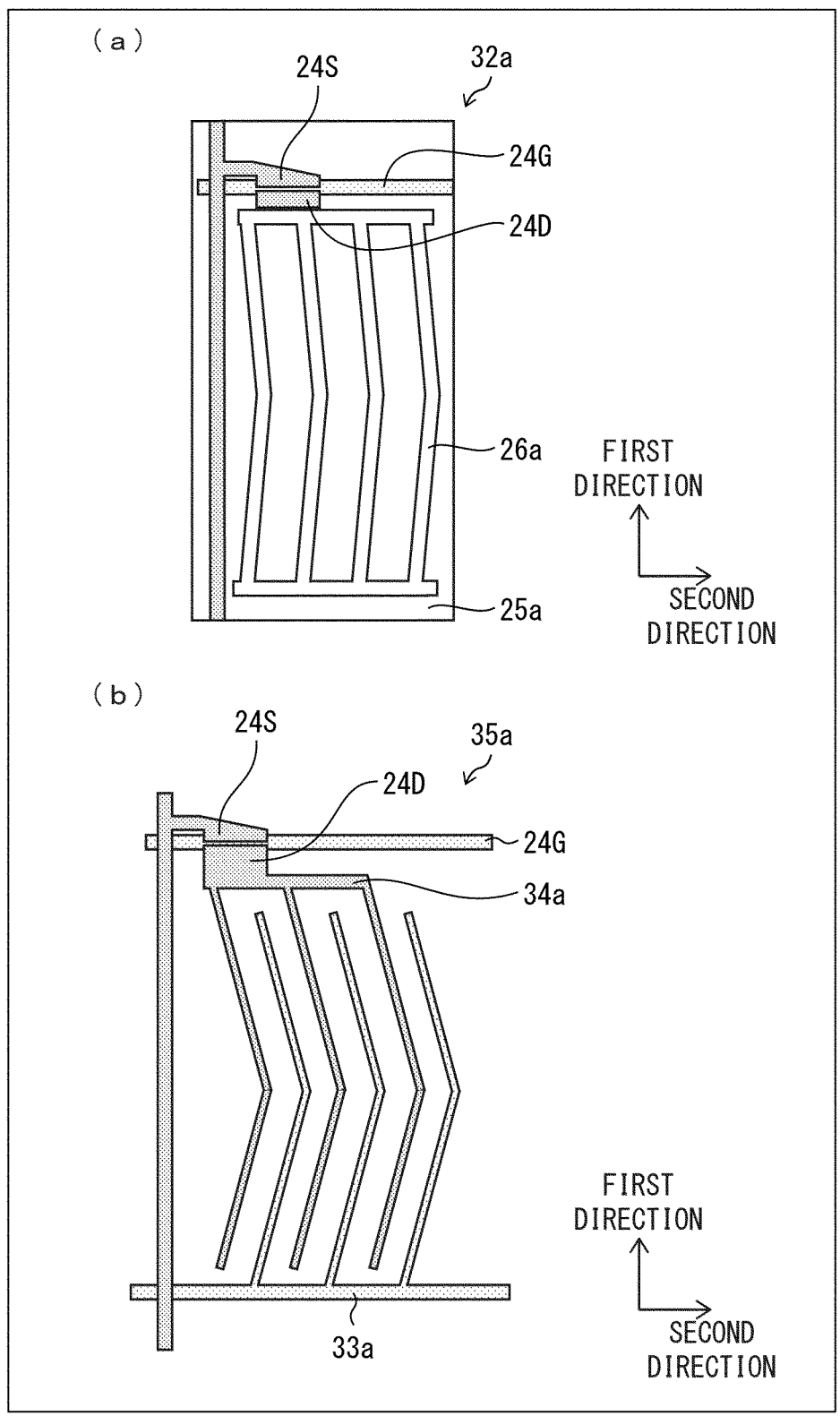
FIG. 7 provides diagrams illustrating a liquid crystal display panel of the FFS mode and a liquid crystal display panel of the IPS mode each having an electrode structure with which liquid crystal molecules are divided into two halves in the up-down direction of the drawing.

The following description will discuss Embodiment 2 of the disclosure with reference to FIGS. 6 and 7. The present embodiment is identical to Embodiment 1 except that the present embodiment includes a liquid crystal display panel 40 in which for pixels 42, 44, and 46 through which an ideal line as a curved boundary line extends, the opening of each of sub-pixels 41R, 41G, 41B, 43R, 43G, 43B, 45R, 45G, and 45B is adjusted only in the second direction orthogonal to the longitudinal direction (first direction), that is, the width in the left-right direction of the drawing (while the dimension in the longitudinal direction (first direction) is kept unchanged). A member of the present embodiment which member is identical in function to a member illustrated in the drawings for Embodiment 1 is assigned the same reference sign and is not described again here for convenience.

(a) of FIG. 6 is a diagram illustrating a liquid crystal display panel 40 having a display region 2 whose edge region has a portion (that is, an upper right region in the drawing) light-shielded by a light-shielding section 3.

(b) of FIG. 6 is a partial enlarged diagram of the portion indicated with "K" in (a) of FIG. 6. As illustrated in the drawing, the liquid crystal display panel 40 is configured such that for the pixels 42, 44, and 46 (through which an ideal line as a curved boundary line extends), the opening of each of the sub-pixels 41R, 41G, 41B, 43R, 43G, 43B, 45R, 45G, and 45B is adjusted only in the second direction orthogonal to the longitudinal direction (first direction), that is, the width in the left-right direction of the drawing (while the dimension in the longitudinal direction (first direction) is kept unchanged).

The liquid crystal display panel 40 is of the TN mode (that is, no sub-pixel is divided in a particular direction). Including sub-pixel light-shielding sections of the light-shielding section 3 in such a manner as to, for the pixels 42, 44, and 46 (through which an ideal line as a curved boundary line extends), simply adjust only the dimension in the second direction orthogonal to the longitudinal direction (first direction), that is, the width in the left-right direction of the drawing, of the opening of each of the sub-pixels 41R, 41G, 41B, 43R, 43G, 43B, 45R, 45G, and 45B can change the opening area without degrading the visual angle property of the liquid crystal display panel 40.

As illustrated in (b) of FIG. 6, the liquid crystal display panel 40 includes, for each of the pixels 42, 44, and 46, sub-pixel light-shielding sections of the light-shielding section 3 each with a predetermined size for the right side in the drawing of the sub-pixels 41R, 41G, 41B, 43R, 43G, 43B, 45R, 45G, and 45B of the pixels 42, 44, and 46 (through which an ideal line as a curved boundary line extends).

The pixel 42, for example, can be divided by the boundary line as the center into a region A (A) and a region B (B) as described above with reference to FIG. 2 for Embodiment 1.

The opening area of the pixel 42 is determined by the size of each sub-pixel portion in the region A (A) in which sub-pixel portion no black matrix layer is present and which sub-pixel portion is an opening.

For example, the opening area of each of the sub-pixels 41R, 41G, and 41B included in the pixel 42 and the opening area of each of the sub-pixels 10R, 10G, and 10B through which the ideal line does not extend have a ratio (for example, the ratio of the opening area of the sub-pixel 41R to the opening area of the sub-pixel 10R) equal to, for example, the ratio of the area of the region A (A) to the area of each of the pixels 42, 44, and 46 or the area of each pixel through which the ideal line does not extend (that is, the ratio of the area of the region A to the sum of the area of the region A and the area of the region B). The liquid crystal display panel 40 included for each sub-pixel a sub-pixel light-shielding section having a predetermined size such that The liquid crystal display panel 40 is configured, in order to prevent the issue of (i) some pixels each including sub-pixels having respective opening areas different from one another and (ii) such pixels each emitting light having an unintended color and leading to a degraded display quality, for example, such that the pixel 42 includes sub-pixels 41R, 41G, and 41B having respective opening areas at a ratio equal to the ratio of the respective opening areas of the sub-pixels included in each pixel through which the ideal line does not extend.

The sub-pixels 41R, 41G, and 41B included in the pixel 42 each have an opening area smaller, in correspondence with a sub-pixel light-shielding section, than that of each of the sub-pixels 10R, 10G, and 10B included in each pixel 11 through which an ideal line as a curved boundary line does not extend.

The liquid crystal display panel 40 is of the TN mode (that is, no sub-pixel is divided in a particular direction). Including sub-pixel light-shielding sections in such a manner as to, for the pixels 42, 44, and 46 (through which an ideal line as a curved boundary line extends), simply adjust only the dimension in the second direction orthogonal to the longitudinal direction (first direction), that is, the width in the left-right direction of the drawing, of each of the sub-pixels 41R, 41G, 41B, 43R, 43G, 43B, 45R, 45G, and 45B can change the opening area without degrading the visual angle property of the liquid crystal display panel 40.

The above description shows that in the case where sub-pixel light-shielding sections of the light-shielding section 3 are included in such a manner as to, for the pixels 42, 44, and 46 (through which an ideal line as a curved boundary line extends), simply adjust only the dimension in the second direction orthogonal to the longitudinal direction (first direction), that is, the width in the left-right direction of the drawing, of the opening of each of the sub-pixels 41R, 41G, 41B, 43R, 43G, 43B, 45R, 45G, and 45B, a liquid crystal display panel of the TN mode may be used suitably. The liquid crystal display panel is, however, not limited to a liquid crystal display panel of the TN mode, and may suitably be of any of various modes described below.

FIG. 7 provides diagrams illustrating a liquid crystal display panel 32*a* of the fringe field switching (FFS) mode and a liquid crystal display panel 35*a* of the in-plane switching (IPS) mode each having an electrode structure with which liquid crystal molecules are divided into two halves in the up-down direction of the drawing.

(a) of FIG. 7 is a diagram schematically illustrating the configuration of a sub-pixel of the liquid crystal display panel 32*a* of the FFS mode (which has an electrode structure with which liquid crystal molecules are divided into two halves in the up-down direction of the drawing). As illustrated in the drawing, each sub-pixel of the liquid crystal display panel 32*a* of the FFS mode has a TFT element. The liquid crystal display panel 32*a* of the FFS mode has a lower substrate provided with (i) a gate line including a gate electrode 24G, (ii) a source line including a source electrode 24S, (iii) a drain electrode 24D, (iv) a common electrode 25*a*, and (v) a pixel electrode 26*a* connected to the drain electrode 24D. The source electrode 24S, the drain electrode 24D, and the source line belong to the same layer. The drain electrode 24D and the source line including the source electrode 24S are apart from each other.

The liquid crystal display panel 32*a* of the FFS mode includes sub-pixels in each of which liquid crystal molecules are divided into two halves in the up-down direction of the drawing due to the respective shapes of the common electrode 25*a* and the pixel electrode 26*a*.

The liquid crystal display panel 32a of the FFS mode includes sub-pixel light-shielding sections in such a manner as to, for each pixel through which an ideal line as a curved boundary line extends, simply adjust only the dimension in the second direction orthogonal to the longitudinal direction (first direction), that is, the width in the left-right direction of the drawing, of the opening of each sub-pixel, and can thereby change the opening area without degrading the visual angle property of the liquid crystal display panel 32a of the FFS mode.

(b) of FIG. 7 is a diagram schematically illustrating the configuration of a sub-pixel of the liquid crystal display panel 35a of the IPS mode (which has an electrode structure with which liquid crystal molecules are divided into two halves in the up-down direction of the drawing). As illustrated in the drawing, each sub-pixel of the liquid crystal display panel 35a of the IPS mode has a TFT element. The liquid crystal display panel 35a of the IPS mode has a lower substrate provided with (i) a gate line including a gate electrode 24G, (ii) a source line including a source electrode 24S, (iii) a drain electrode 24D, (iv) a common electrode 33a, and (v) a pixel electrode 34a connected to the drain electrode 24D. The source electrode 24S, the drain electrode 24D, and the source line belong to the same layer. The drain electrode 24D and the source line including the source electrode 24S are apart from each other.

The liquid crystal display panel 35a of the IPS mode includes sub-pixels in each of which liquid crystal molecules are divided into two halves in the up-down direction of the drawing due to the respective shapes of the common electrode 33a and the pixel electrode 34a.

The liquid crystal display panel 35a of the IPS mode includes sub-pixel light-shielding sections in such a manner as to, for each pixel through which an ideal line as a curved boundary line extends, simply adjust only the dimension in the second direction orthogonal to the longitudinal direction (first direction), that is, the width in the left-right direction of the drawing, of the opening of each sub-pixel, and can thereby change the opening area without degrading the visual angle property of the liquid crystal display panel 35a of the IPS mode.

Embodiment 3

Figure 8:
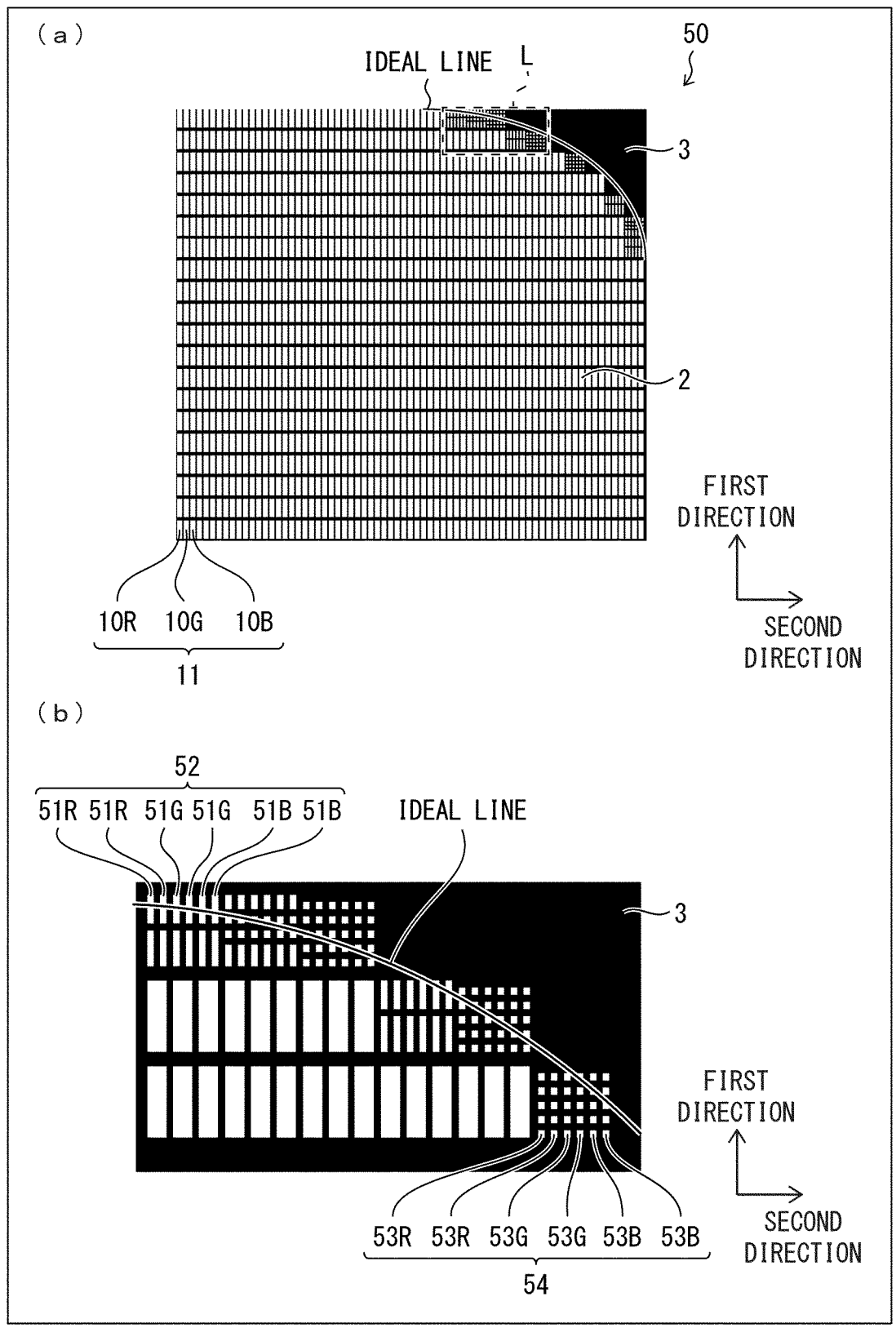
FIG. 8 provides diagrams illustrating still another liquid crystal display panel having a display region whose edge region has a portion (that is, an upper right region in the drawing) light-shielded by a light-shielding section.
Figure 9:
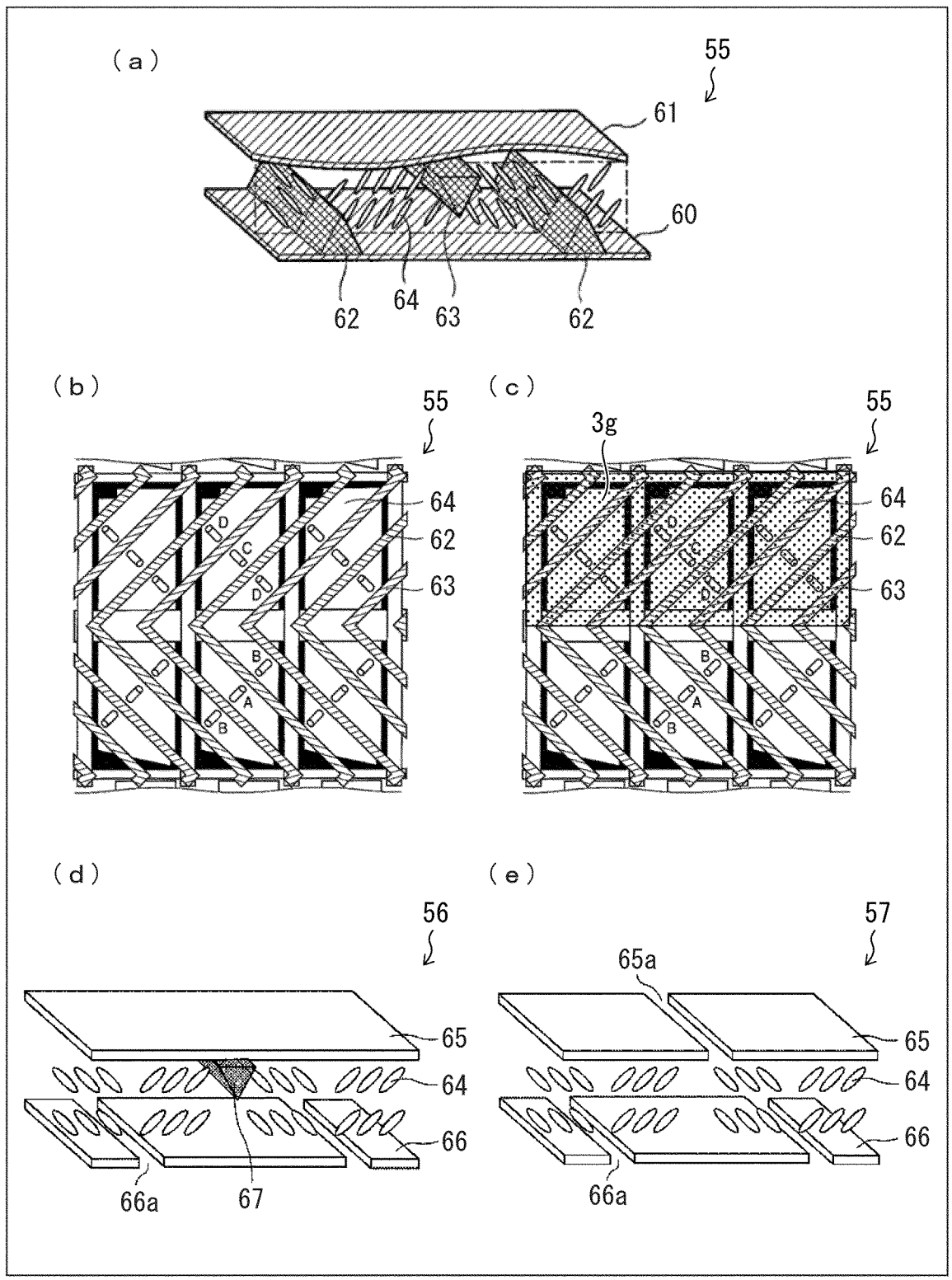
FIG. 9 provides diagrams illustrating a liquid crystal display panel of the MVA mode and a liquid crystal display panel of the PVA mode.

The following description will discuss Embodiment 3 of the disclosure with reference to FIGS. 8 and 9. The present embodiment is identical to Embodiments 1 and 2 except that the present embodiment includes a liquid crystal display panel 50 in which for pixels 52 and 54, for example, through which an ideal line as a curved boundary line extends, (i) the light-shielding section 3 includes sub-pixel light-shielding sections each in the shape of a mesh having a plurality of openings, and (ii) the density of the openings is varied for adjustment of the size of the opening of each of sub-pixels 51R, 51G, 51B, 53R, 53G, and 53B, that is, the size of each sub-pixel light-shielding section of the light-shielding section 3. A member of the present embodiment which member is identical in function to a member illustrated in the drawings for Embodiments 1 and 2 is assigned the same reference sign and is not described again here for convenience.

(a) of FIG. 8 is a diagram illustrating a liquid crystal display panel 50 having a display region 2 whose edge region has a portion (that is, an upper right region in the drawing) light-shielded by a light-shielding section 3.

(b) of FIG. 8 is a partial enlarged diagram of the portion indicated with "L" in (a) of FIG. 8. As illustrated in the drawing, the liquid crystal display panel 50 is configured such that for pixels 52 and 54, for example, through which an ideal line as a curved boundary line extends, (i) the light-shielding section 3 includes sub-pixel light-shielding sections each in the shape of a mesh having a plurality of openings, and (ii) the density of the openings is varied for adjustment of the size of the opening of each of sub-pixels 51R, 51G, 51B, 53R, 53G, and 53B, that is, the size of each sub-pixel light-shielding section of the light-shielding section 3.

As illustrated in (b) of FIG. 8, the liquid crystal display panel 50 is configured such that the sub-pixel light-shielding sections of the light-shielding section 3 each have openings whose size and number vary according to what position of the pixel an ideal line as a curved boundary line extends through. Specifically, a sub-pixel light-shielding section of the light-shielding section 3 has openings whose size is smaller and whose number is larger for a pixel whose portion covered by the light-shielding section 3 having the boundary line is larger. On the other hand, a sub-pixel light-shielding section of the light-shielding section 3 has openings whose size is larger and whose number is smaller for a pixel whose portion covered by the light-shielding section 3 having the boundary line is smaller.

The liquid crystal display panel 50 is configured such that (i) the light-shielding section 3 includes sub-pixel light-shielding sections each in the shape of a mesh having a plurality of openings, and (ii) the density of the openings is varied for adjustment of, for example, the size of the opening of each of sub-pixels 51R, 51G, 51B, 53R, 53G, and 53B, that is, the size of each sub-pixel light-shielding section of the light-shielding section 3. The liquid crystal display panel 50 will not have a degraded visual angle property even if the liquid crystal display panel 50 is of the multi-domain vertical alignment (MVA) mode or of the patterned vertical alignment (PVA) mode.

With reference to FIG. 9, the description below deals with how the liquid crystal display panel 50 will not have a degraded visual angle property even in a case where the liquid crystal display panel 50 is of the MVA mode or of the PVA mode.

(a) of FIG. 9 is a diagram schematically illustrating the configuration of a liquid crystal display panel 55 of the MVA mode which liquid crystal display panel 55 includes lower ribs 62 and upper ribs 63.

As illustrated in the drawing, the liquid crystal display panel 55 of the MVA mode includes (i) a lower electrode 60 provided with the lower ribs 62, (ii) an upper electrode 61 provided with the upper ribs 63, and (iii) liquid crystal molecules 64 between the lower electrode 60 and the upper electrode 61.

(b) of FIG. 9 is a diagram illustrating how liquid crystal molecules 64 are aligned in the liquid crystal display panel 55 of the MVA mode. As illustrated in the drawing, the liquid crystal display panel 55 of the MVA mode is configured such that the liquid crystal display panel 55 is divided with use of the ribs 62 and 63 as an orientation aligner into a plurality of in-plane domains (namely, four domains A, B, C, and D) and that the ribs 62 and 63 and a fringe electric field (oblique electric field) generated in response to voltage application are used to tilt the liquid crystal molecules 64 to different directions in different domains for uniform display of a screen in various directions.

(c) of FIG. 9 is a diagram illustrating a case where the liquid crystal display panel 55 of the MVA mode includes a normal sub-pixel light-shielding section 3g having no opening. In a case where the liquid crystal display panel 55 of the MVA mode uses the normal sub-pixel light-shielding section 3g having no opening to shield only the upper half of a pixel from light as illustrated in the drawing, only the domains A and B among the four domains A, B, C, and D allow passage of light, unfortunately degrading the visual angle property.

For the above reason, the liquid crystal display panel 55 of the MVA mode preferably includes, instead of the normal sub-pixel light-shielding section 3g illustrated in (c) of FIG. 9, a sub-pixel light-shielding section in the shape of a mesh having a plurality of openings as illustrated in FIG. 8.

(d) of FIG. 9 is a diagram schematically illustrating the configuration of a liquid crystal display panel 56 of the MVA mode which liquid crystal display panel 56 includes (i) a lower electrode 66 having slits 66a, (ii) an upper electrode 65 provided with upper ribs 67, and (iii) liquid crystal molecules 64 between the lower electrode 66 and the upper electrode 65.

The liquid crystal display panel 56 of the MVA mode is configured such that the liquid crystal display panel 56 is divided with use of the slits 66a and the upper ribs 67 as an orientation aligner into a plurality of in-plane domains (namely, four domains A, B, C, and D) and that the slits 66a, the upper ribs 67, and a fringe electric field (oblique electric field) generated in response to voltage application are used to tilt the liquid crystal molecules 64 to different directions in different domains for uniform display of a screen in various directions.

For the same reason as that for the above-described liquid crystal display panel 55 of the MVA mode, the liquid crystal display panel 56 of the MVA mode preferably includes, instead of the normal sub-pixel light-shielding section 3g as illustrated in (c) of FIG. 9, a sub-pixel light-shielding section in the shape of a mesh having a plurality of openings as illustrated in FIG. 8.

(e) of FIG. 9 is a diagram schematically illustrating the configuration of a liquid crystal display panel 57 of the PVA mode which liquid crystal display panel 57 includes (i) an upper electrode 65 having slits 65a, (ii) a lower electrode 66 having slits 66a, and (iii) liquid crystal molecules 64 between the upper electrode 65 and the lower electrode 66.

The liquid crystal display panel 57 of the PVA mode is configured such that the liquid crystal display panel 57 is divided with use of the slits 65a and 66a as an orientation aligner into a plurality of in-plane domains (namely, four domains A, B, C, and D), that applying a voltage to the liquid crystal layer causes the liquid crystal molecules 64 to be oriented vertically, and that the slits 65a and 66a and a fringe electric field (oblique electric field) generated in response to voltage application are used to tilt the liquid crystal molecules 64 to different directions in different domains for uniform display of a screen in various directions.

For the same reason as that for the above-described liquid crystal display panels 55 and 56 of the MVA mode, the liquid crystal display panel 57 of the PVA mode preferably includes, instead of the normal sub-pixel light-shielding section 3g as illustrated in (c) of FIG. 9, a sub-pixel light-shielding section in the shape of a mesh having a plurality of openings as illustrated in FIG. 8.

A liquid crystal display panel including a sub-pixel light-shielding section in the shape of a mesh may be of the MVA mode or of the PVA mode as well as of the TN mode, the FFS mode, or the IPS mode.

Embodiment 4

Figure 10:
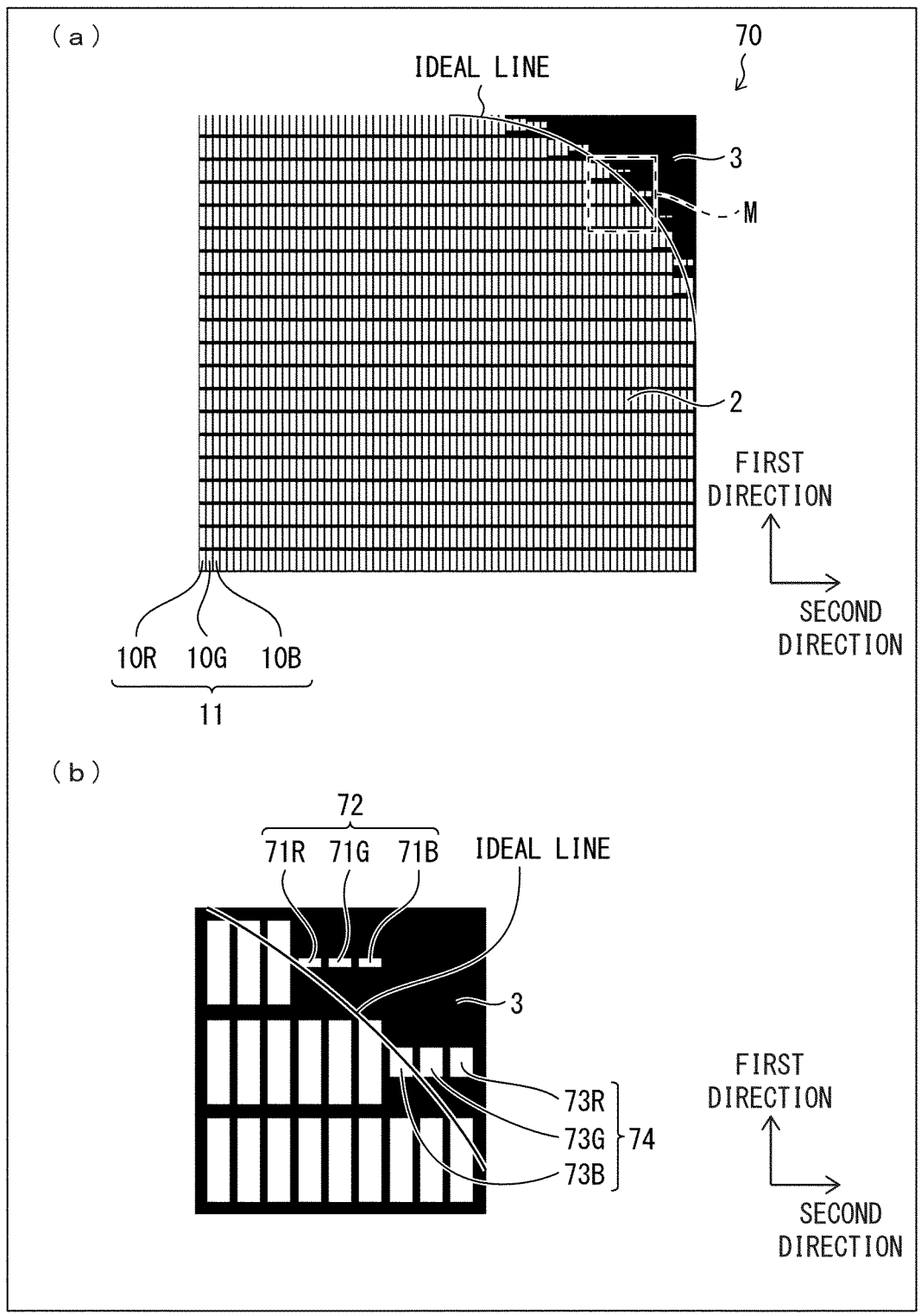
FIG. 10 provides diagrams illustrating still another liquid crystal display panel having a display region whose edge region has a portion (that is, an upper right region in the drawing) light-shielded by a light-shielding section.

The following description will discuss Embodiment 4 of the disclosure with reference to FIG. 10. The present embodiment is identical to Embodiments 1 to 3 except that the present embodiment includes a liquid crystal display panel 70 in which for pixels 72 and 74, for example, through which an ideal line as a curved boundary line extends, the light-shielding section 3 includes sub-pixel light-shielding sections such that the opening of each of sub-pixels 71R, 71G, 71B, 73R, 73G, and 73B is positioned in the vicinity of the center of the sub-pixel in the first direction. A member of the present embodiment which member is identical in function to a member illustrated in the drawings for Embodiments 1 to 3 is assigned the same reference sign and is not described again here for convenience.

(a) of FIG. 10 is a diagram illustrating a liquid crystal display panel 70 having a display region 2 whose edge region has a portion (that is, an upper right region in the drawing) light-shielded by a light-shielding section 3.

(b) of FIG. 10 is a partial enlarged diagram of the portion indicated with "M" in (a) of FIG. 10. As illustrated in the drawing, the liquid crystal display panel 70 is configured such that for pixels 72 and 74, for example, through which an ideal line as a curved boundary line extends, the light-shielding section 3 includes sub-pixel light-shielding sections such that the opening of each of sub-pixels 71R, 71G, 71B, 73R, 73G, and 73B is positioned in the vicinity of the center of the sub-pixel in the first direction.

The opening of each of the sub-pixels 71R, 71G, 71B, 73R, 73G, and 73B of the pixels 72 and 74 is adjusted in, for example, only the longitudinal direction (first direction), that is, the length in the up-down direction of the drawing (while the width in the second direction is kept unchanged) depending on what position of the pixel an ideal line as a curved boundary line extends through.

The sub-pixel light-shielding sections included in the liquid crystal display panel 70 in accordance with the present embodiment are suitably usable for a case where the pixels are small and it is difficult to form a sub-pixel light-shielding section in the shape of a mesh having a plurality of openings as in Embodiment 3 above.

The liquid crystal display panel 70, which includes sub-pixels each having an opening in the vicinity of the center of the sub-pixel in the first direction so that liquid crystal molecules are aligned uniformly in all directions, can change the opening area while maintaining the visual angle property.

Embodiment 5

Figure 11:
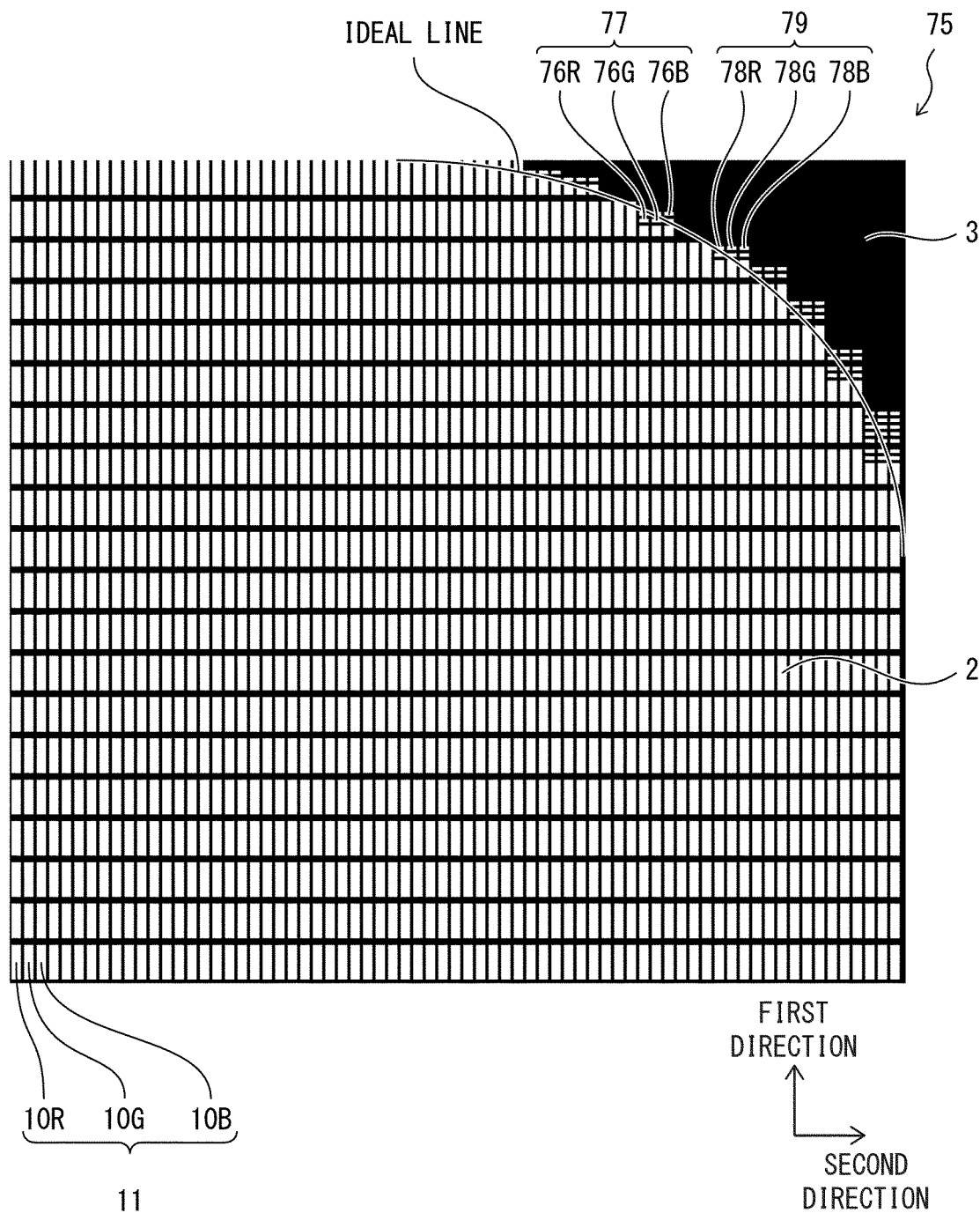
FIG. 11 provides diagrams illustrating still another liquid crystal display panel having a display region whose edge region has a portion (that is, an upper right region in the drawing) light-shielded by a light-shielding section.

The following description will discuss Embodiment 5 of the disclosure with reference to FIG. 11. The present embodiment is identical to Embodiments 1 to 4 except that the present embodiment includes a liquid crystal display panel 75 in which for at least one of pixels through which an ideal line as a curved boundary line extends, a portion of a sub-pixel is defined by a sub-pixel light-shielding section having a plurality of openings and having a mesh shape. A member of the present embodiment which member is identical in function to a member illustrated in the drawings for Embodiments 1 to 4 is assigned the same reference sign and is not described again here for convenience.

FIG. 11 provides diagrams illustrating a liquid crystal display panel 75 having a display region 2 whose edge region has a portion (that is, an upper right region in the drawing) light-shielded by a light-shielding section 3.

As illustrated in the drawing, pixels 77 and 79 as an example of one or more pixels through which an ideal line as a curved boundary line extends include sub-pixels 76R, 76G, 76B, 78R, 78G, and 78B each having an opening that includes an upper portion in the first direction and a lower portion in the first direction.

The upper portion in the first direction is defined by a sub-pixel light-shielding section having a plurality of openings and having a mesh shape. The lower portion in the first direction is defined by a sub-pixel light-shielding section having a single opening.

Forming sub-pixels as above allows the boundary between the display region 2 and the light-shielding section 3 to look smoother. It is preferable to form sub-pixels as described above in a case where the pixels are large and the boundary between the display region 2 and the light-shielding section 3 are visibly in the shape of stairs.

The present embodiment described here is an example case in which the upper portion in the first direction is defined by a sub-pixel light-shielding section having a plurality of openings and having a mesh shape and in which the lower portion in the first direction is defined by a sub-pixel light-shielding section having a single opening. The present embodiment is, however, not limited to such a configuration. The present embodiment may alternatively be configured such that the upper portion in the first direction is defined by a sub-pixel light-shielding section having a single opening and that the lower portion in the first direction is defined by a sub-pixel light-shielding section having a plurality of openings and having a mesh shape. The present embodiment may further alternatively be configured such that a first one of the right portion and left portion in the second direction is defined by a sub-pixel light-shielding section having a plurality of openings and having a mesh shape and that a second one of the right portion and left portion in the second direction is defined by a sub-pixel light-shielding section having a single opening.

Embodiment 6

Figure 12:
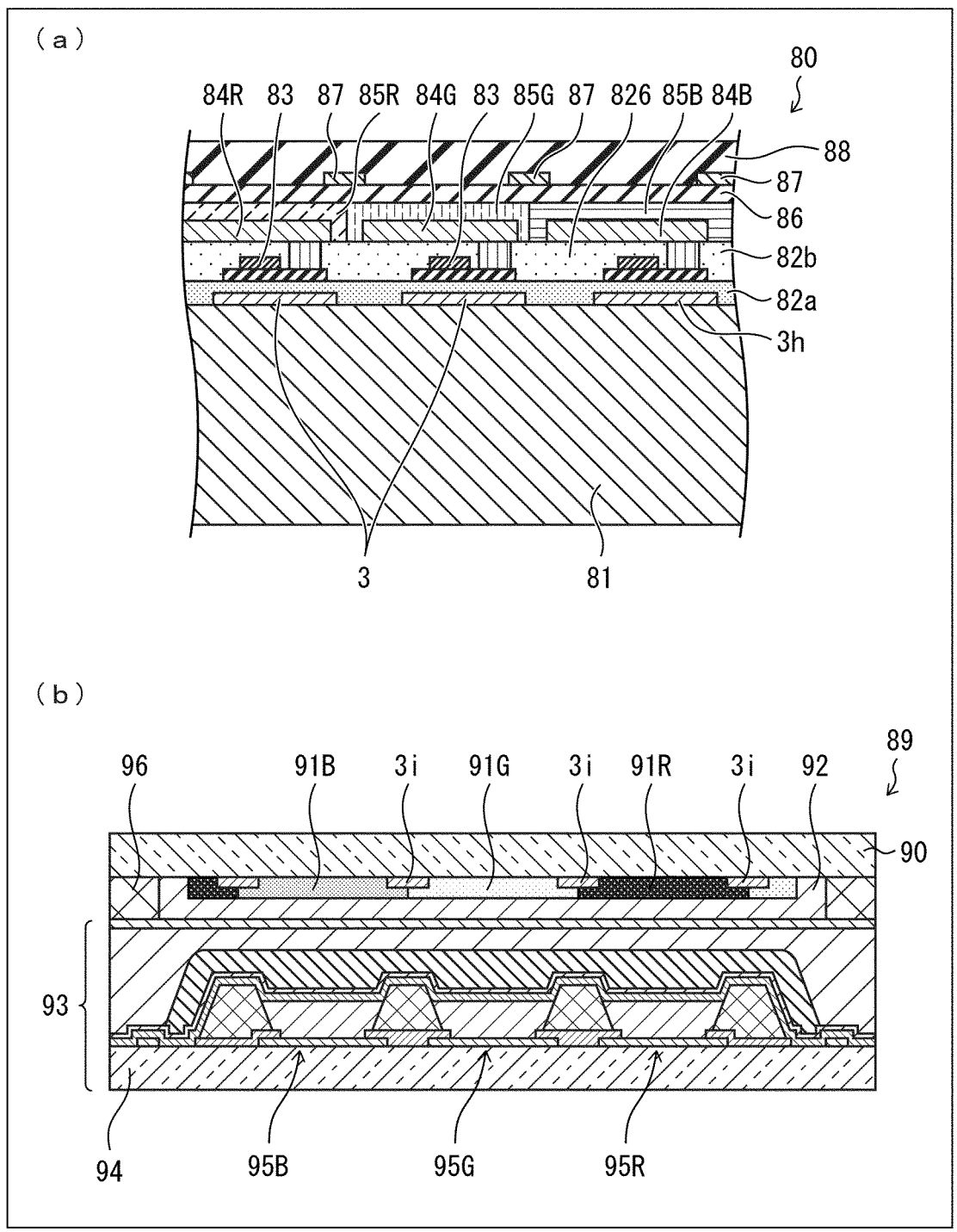
FIG. 12 provides diagrams schematically illustrating the configuration of an organic EL display panel.
Figure 13:
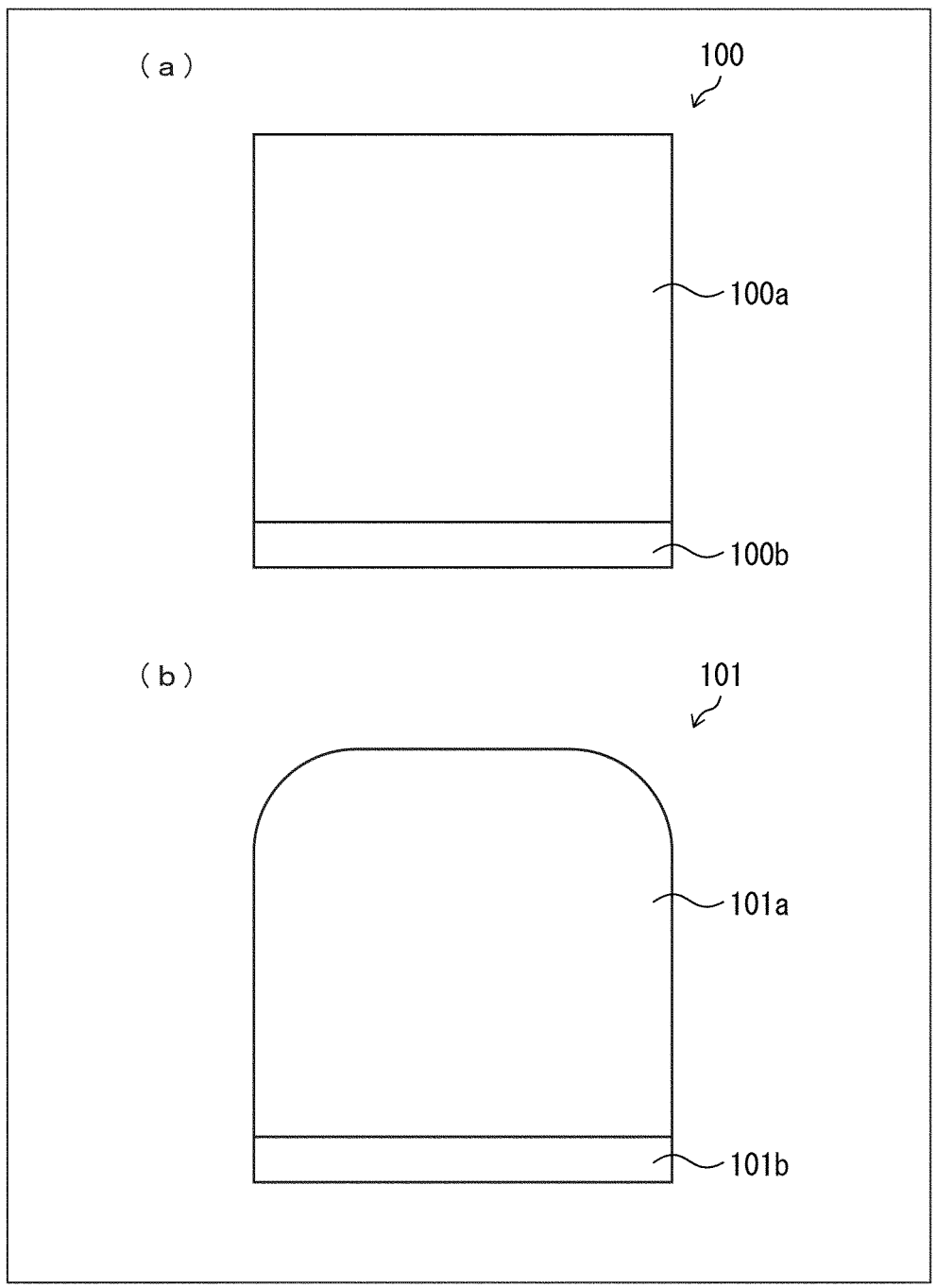
FIG. 13 provides diagrams illustrating (i) an example liquid crystal display panel having a normal, rectangular display region and (ii) an example liquid crystal display panel having a display region in an irregular shape.
Figure 14:
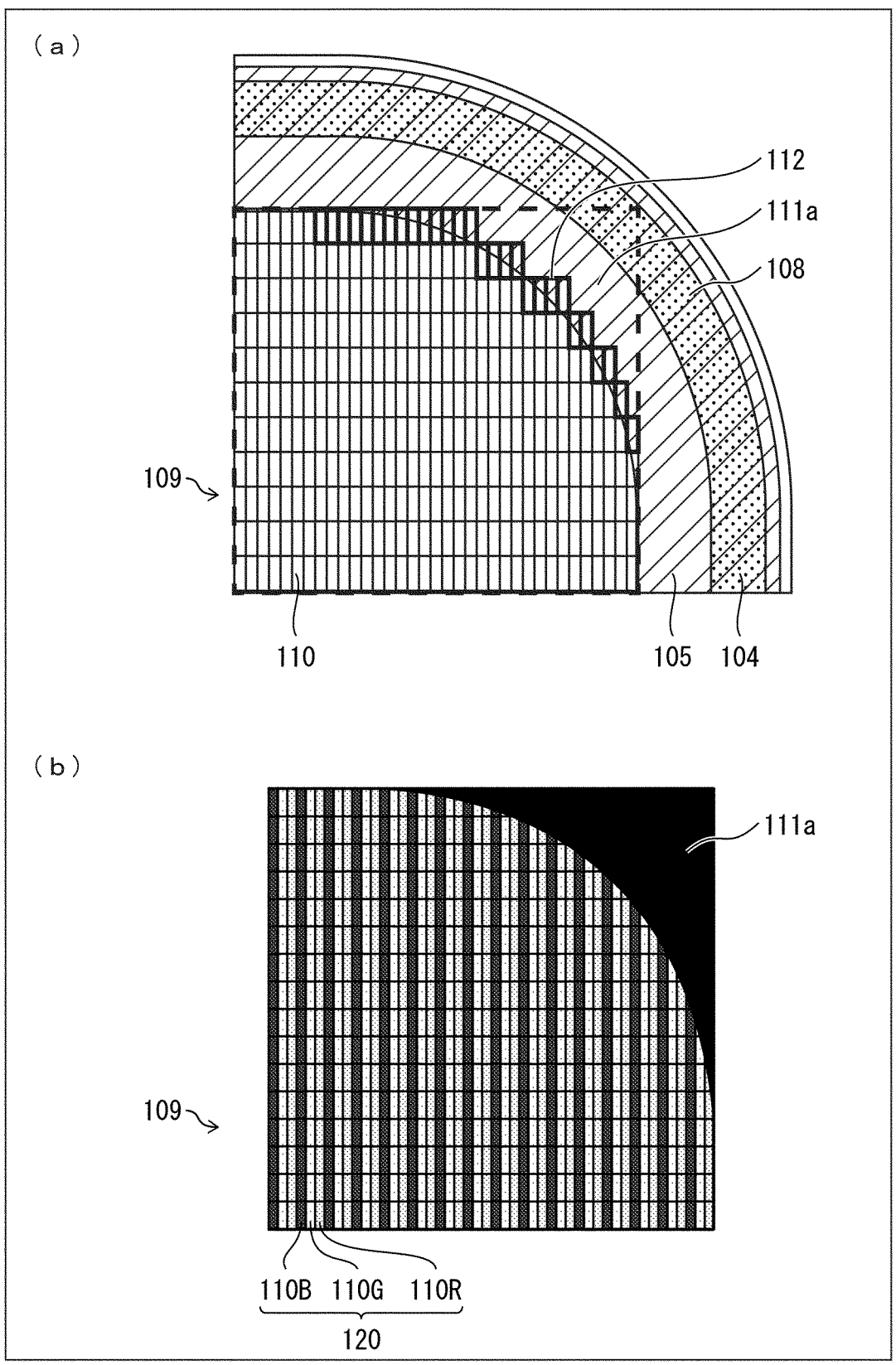
FIG. 14 provides diagrams illustrating a display panel disclosed in Patent Literature 1 which display panel has a display region with a curved edge.
Figure 15:
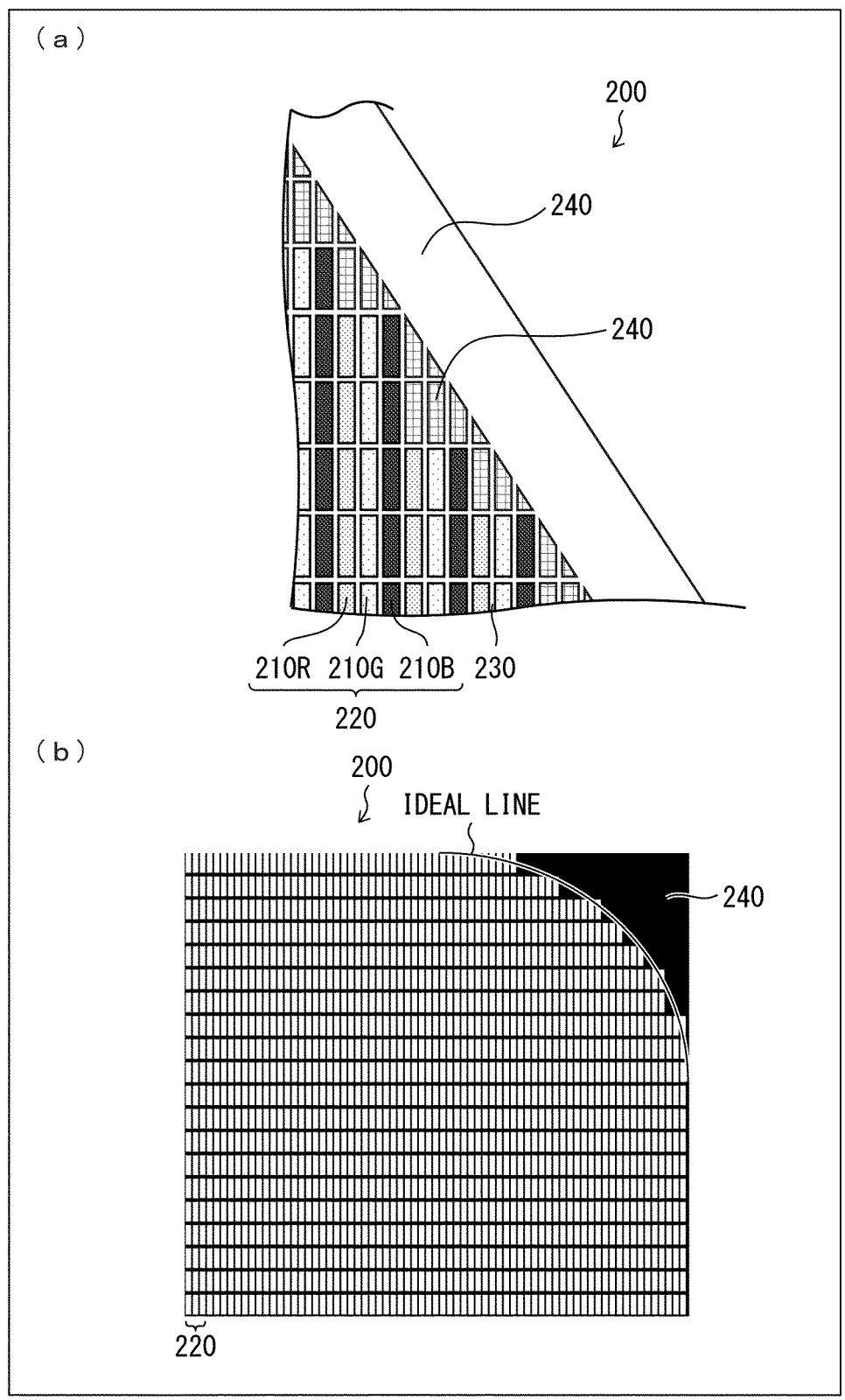
FIG. 15 provides diagrams illustrating a display panel having a display region with a curved edge, which display panel alleviates the issue of pixels at an edge of a display region each emitting light having an unintended color, leading to a degraded display quality.
Figure 16:
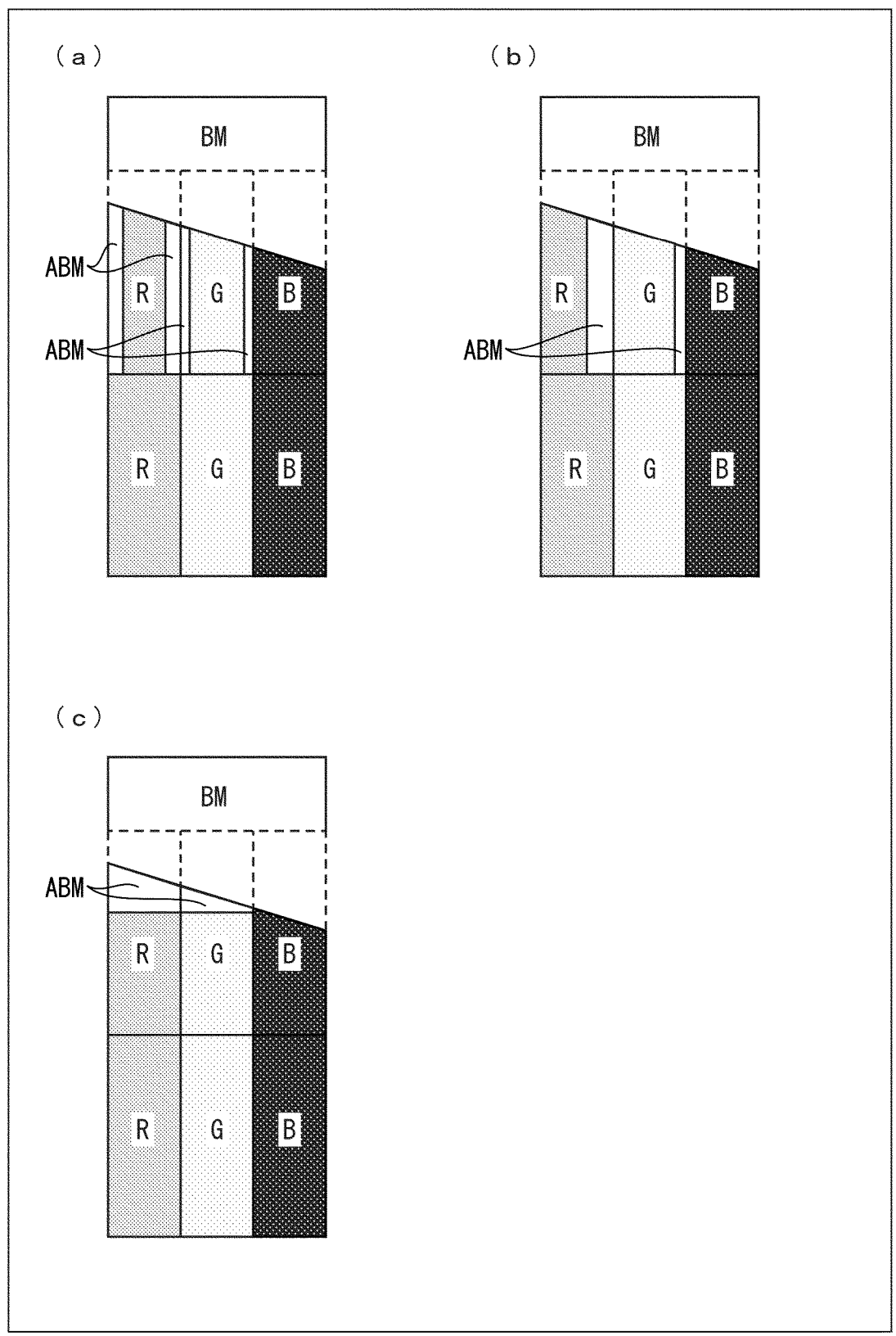
FIG. 16 provides diagrams illustrating a display panel disclosed in Patent Literature 2 which display panel has a display region with a curved edge.

The following description will discuss Embodiment 6 of the disclosure with reference to FIG. 12. The present embodiment is identical to Embodiments 1 to 5 except that the present embodiment includes an organic EL display panel 80 or 89 including, instead of a liquid crystal layer, light-emitting layers of respective colors different from each other. A member of the present embodiment which member is identical in function to a member illustrated in the drawings for Embodiments 1 to 5 is assigned the same reference sign and is not described again here for convenience.

(a) of FIG. 12 is a diagram schematically illustrating the configuration of the organic EL display panel 80.

The organic EL display panel 80 includes (i) an array substrate 81, (ii) sub-pixel light-shielding sections 3h on the array substrate 81 each at a position corresponding to a sub-pixel, (iii) a planarizing film 82a provided in such a manner as to cover the sub-pixel light-shielding sections 3h, (iv) TFT elements 83 on the planarizing film 82a each at a position corresponding to a sub-pixel, (v) a planarizing film 82b provided in such a manner as to cover the TFT elements 83, (vi) transparent electrodes 84R, 84G, and 84B each connected to a corresponding one of the respective drain electrodes of the TFT elements 83, (vii) organic light-emitting layers 85R, 85G, and 85B each provided on a corresponding one of the transparent electrodes 84R, 84G, and 84B, (viii) a transparent electrode 86, (ix) low-resistance lines 87, and (x) a circularly polarizing plate 88.

The organic EL display panel 80 is of the bottom emission type, that is, causes light to be emitted from the side of the array substrate 81. The organic EL display panel 80 thus includes sub-pixel light-shielding sections 3h on the side of the array substrate 81. In a case where the organic EL display panel 80 is of the top emission type, the organic EL display panel 80 may use, for example, the low-resistance lines 87 as sub-pixel light-shielding sections.

The sub-pixel light-shielding sections for the organic EL display panel 80 may be provided similarly to the liquid crystal display panels described above as Embodiments 1 to 5, and are not described in detail here again. An organic EL display panel includes an organic light-emitting layer that does not have an orientation alignment property similar to that of liquid crystal molecules in a liquid crystal layer. Such an alignment property thus does not need to be considered when sub-pixel light-shielding sections are to be formed.

(b) of FIG. 12 is a diagram schematically illustrating the configuration of an organic EL display panel 89 including a color filter substrate 90.

The organic EL display panel 89 includes an element substrate 93, a color filter substrate 90, and a dam material 96 via which the element substrate 93 and the color filter substrate 90 are attached to each other.

The element substrate 93 includes (i) a substrate 94 and (ii) organic EL elements 95R, 95G, and 95B provided on the substrate 94 and including respective light-emitting layers of different colors. The color filter substrate 90 is provided with, on a surface thereof that faces the element substrate 93, (i) sub-pixel light-shielding sections 3i, (ii) color filter layers 91R, 91G, and 91B having respective colors, and (iii) a transparent resin layer 92.

The organic EL display panel 89 causes light to be emitted from the side of the color filter substrate 90, and thus uses, as sub-pixel light-shielding sections 3i, a black matrix layer provided on the side of the color filter substrate 90.

The sub-pixel light-shielding sections for the organic EL display panel 89 may be provided similarly to the liquid crystal display panels described above as Embodiments 1 to 5, and are not described in detail here again. An organic EL display panel includes an organic light-emitting layer that does not have an alignment property similar to that of liquid crystal molecules in a liquid crystal layer. Such an alignment property thus does not need to be considered when sub-pixel light-shielding sections are to be formed.

[Recap]

A display panel in accordance with a first aspect of the disclosure is a display panel, comprising:

a display region including a plurality of pixels that are arranged in a matrix, wherein the plurality of pixels include central pixels arranged in a central region of the display region and one or more edge pixels arranged in an edge region of the display region, each of the central pixels and the one or more edge pixels includes a first sub-pixel, a second-sub pixel, and a third sub-pixel which are arranged side by side in a row direction of the matrix, each of the first sub-pixel, the second sub-pixel, and the third sub-pixel of the central pixels includes a central opening portion and a central light shielding portion surrounding the central opening portion, each of the first sub-pixel, the second sub-pixel, and the third sub-pixel of the one or more edge pixels includes an edge opening portion and an edge light shielding portion surrounding the edge opening portion, and a length of the edge opening portion in a column direction of the matrix is shorter than a length of the central opening portion in the column direction, and a length of the edge opening portion in the row direction is shorter than a length of the central opening portion in the row direction.

A display panel in accordance with a second aspect of the disclosure is configured as in the first aspect and may be further configured such that each edge opening portion is divided in the column direction and the row direction by a corresponding edge light shielding portion of the first sub-pixel, the second sub-pixel, and the third sub-pixel in the one or more edge pixels.

A display panel in accordance with a third aspect of the disclosure is configured as in the second aspect and may be further configured such that each edge opening portion includes a plurality of sub opening portions.

A display panel in accordance with a fourth aspect of the disclosure is configured as in the third aspect and may be further configured such that a pair of the one or more edge pixels are arranged side by side in at least one row of the matrix, and a number of the sub opening portions in each of the pair of the one or more edge pixels increases in the one or more edge pixels located farther from the central region toward the edge region.

A display panel in accordance with a fifth aspect of the disclosure is configured as in the second aspect and may be further configured such that each edge light shielding portion has a mesh shape.

A display panel in accordance with a sixth aspect of the disclosure is configured as in the first aspect and may be further configured such that a pair of the one or more edge pixels are arranged side by side in at least one row of the matrix.

A display panel in accordance with a seventh aspect of the disclosure is configured as in the sixth aspect and may be further configured such that an area of the edge opening portion of one of the pair of the one or more edge pixels that is closest to the central region is larger than an area of the edge opening portion of the other of the pair of the one or more edge pixels.

A display panel in accordance with an eighth aspect of the disclosure is configured as in the first aspect and may be further configured such that the one or more edge pixels are further arranged in a plurality of rows of the matrix, and an outer peripheral edge of the one or more edge pixels has a step shape.

A display panel in accordance with a ninth aspect of the disclosure is configured as in the sixth aspect and may be further configured such that the pair of the one or more edge pixels are arranged in a plurality of the rows of the matrix, and a size of each edge opening portion of an outermost pixel of the pair of the one or more edge pixels in each of the plurality of rows is the same.

A display panel in accordance with a tenth aspect of the disclosure is configured as in the first aspect and may be further configured such that the first sub-pixel, the second sub-pixel, and the third sub-pixel of the central pixels and the edge pixels each includes a liquid crystal layer.

A display panel in accordance with an eleventh aspect of the disclosure is a display panel, comprising: a display region including a plurality of pixels that are arranged in a matrix, wherein the plurality of pixels include central pixels arranged in a central region of the display region and one or more edge pixels arranged in an edge region of the display region, each of the central pixels and the one or more edge pixels includes a first sub-pixel, a second-sub pixel, and a third sub-pixel which are arranged side by side in a row direction of the matrix, each of the first sub-pixel, the second sub-pixel, and the third sub-pixel in the central pixels includes a central light emitting portion and a central non-light emitting portion surrounding the central light emitting portion, each of the first sub-pixel, the second sub-pixel, and the third-pixel in the one or more edge pixels includes an edge light emitting portion and an edge non-light emitting portion surrounding the edge light emitting portion, and a length of the edge light emitting portion in a column direction of the matrix is shorter than a length of the central light emitting portion in the column direction, and a length of the edge light emitting portion in the row direction is shorter than a length of central light emitting portion in the row direction.

A display panel in accordance with a twelfth aspect of the disclosure is configured as in the eleventh aspect and may be further configured such that each edge light emitting portion is divided in the column direction and the row direction by the corresponding edge non-light emitting portion of the first sub-pixel, the second sub-pixel, and the third sub-pixel in the one or more edge pixels.

A display panel in accordance with a thirteenth aspect of the disclosure is configured as in the twelfth aspect and may be further configured such that each edge light emitting portion includes a plurality of sub light emitting portions.

A display panel in accordance with a fourteenth aspect of the disclosure is configured as in the thirteenth aspect and may be further configured such that a pair of the one or more edge pixels are arranged side by side in at least one row of the matrix, and a number of the sub light emitting portions in each of the pair of the one or more edge pixels increases in the one or more edge pixels located farther from the central region toward the edge region.

A display panel in accordance with a fifteenth aspect of the disclosure is configured as in the twelfth aspect and may be further configured such that each edge non-light emitting portion has a mesh shape.

A display panel in accordance with a sixteenth aspect of the disclosure is configured as in the eleventh aspect and may be further configured such that a pair of the one or more edge pixels are arranged side by side in at least one row of the matrix.

A display panel in accordance with a seventeenth aspect of the disclosure is configured as in the sixteenth aspect and may be further configured such that an area of the edge light emitting portion of one of the pair of the one or more edge pixels that is closest to the central region is larger than an area of the edge light emitting portion of the other of the pair of the one or more edge pixels.

A display panel in accordance with an eighteenth aspect of the disclosure is configured as in the eleventh aspect and may be further configured such that the one or more edge pixels are further arranged in a plurality of rows of the matrix, and an outer peripheral edge of the one or more edge pixels has a step shape.

A display panel in accordance with a nineteenth aspect of the disclosure is configured as in the sixteenth aspect and may be further configured such that the pair of the one or more edge pixels are arranged in a plurality of the rows of the matrix, and a size of each edge light emitting portion of an outermost pixel of the pair of the one or more edge pixels in each of the plurality of rows is the same.

[Supplemental Notes]

The disclosure is not limited to the embodiments, but can be altered by a skilled person in the art within the scope of the claims. The disclosure also encompasses, in its technical scope, any embodiment derived by combining technical means disclosed in differing embodiments. Further, it is possible to form a new technical feature by combining the technical means disclosed in the respective embodiments.

INDUSTRIAL APPLICABILITY

The disclosure is applicable to a display panel such as a liquid crystal display panel or an organic EL display panel.

REFERENCE SIGNS LIST

1 Liquid crystal display panel (display panel)
2 Display region
3 Light-shielding section
3a Sub-pixel light-shielding section
3b Sub-pixel light-shielding section
3c Sub-pixel light-shielding section
3d Sub-pixel light-shielding section
3e Sub-pixel light-shielding section
3f Sub-pixel light-shielding section
3g Sub-pixel light-shielding section
3h Sub-pixel light-shielding section
3i Sub-pixel light-shielding section
4R Red sub-pixel (first sub-pixel)
4G Green sub-pixel (second sub-pixel)
4B Blue sub-pixel (third sub-pixel)
5 Pixel
6R Red sub-pixel (first sub-pixel)
6G Green sub-pixel (second sub-pixel)
6B Blue sub-pixel (third sub-pixel)
7 Pixel
8R Red sub-pixel (first sub-pixel)
8G Green sub-pixel (second sub-pixel)
8B Blue sub-pixel (third sub-pixel)
9 Pixel
10R Red sub-pixel (first sub-pixel)
10G Green sub-pixel (second sub-pixel)
10B Blue sub-pixel (third sub-pixel)
11 Pixel
13R Red sub-pixel (first sub-pixel)
13G Green sub-pixel (second sub-pixel)
13B Blue sub-pixel (third sub-pixel)
20 Liquid crystal display panel (display panel)
22 Liquid crystal display panel (display panel)
32 Liquid crystal display panel (display panel)
32a Liquid crystal display panel (display panel)
35 Liquid crystal display panel (display panel)
35a Liquid crystal display panel (display panel)
40 Liquid crystal display panel (display panel)
41R Red sub-pixel (first sub-pixel)
41G Green sub-pixel (second sub-pixel)
41B Blue sub-pixel (third sub-pixel)
42 Pixel
43R Red sub-pixel (first sub-pixel)
43G Green sub-pixel (second sub-pixel)
43B Blue sub-pixel (third sub-pixel)
44 Pixel
45R Red sub-pixel (first sub-pixel)
45G Green sub-pixel (second sub-pixel)
45B Blue sub-pixel (third sub-pixel)
46 Pixel
Liquid crystal display panel (display panel)
51R Red sub-pixel (first sub-pixel)
51G Green sub-pixel (second sub-pixel)
51B Blue sub-pixel (third sub-pixel)
52 Pixel
53R Red sub-pixel (first sub-pixel)
53G Green sub-pixel (second sub-pixel)
53B Blue sub-pixel (third sub-pixel)
54 Pixel
55 Liquid crystal display panel (display panel)
56 Liquid crystal display panel (display panel)
57 Liquid crystal display panel (display panel)
70 Liquid crystal display panel (display panel)
71R Red sub-pixel (first sub-pixel)
71G Green sub-pixel (second sub-pixel)
71B Blue sub-pixel (third sub-pixel)
72 Pixel
73R Red sub-pixel (first sub-pixel)
73G Green sub-pixel (second sub-pixel)
73B Blue sub-pixel (third sub-pixel)
74 Pixel
75 Liquid crystal display panel (display panel)
76R Red sub-pixel (first sub-pixel)
76G Green sub-pixel (second sub-pixel)
76B Blue sub-pixel (third sub-pixel)
77 Pixel
78R Red sub-pixel (first sub-pixel)
78G Green sub-pixel (second sub-pixel)
78B Blue sub-pixel (third sub-pixel)
79 Pixel
80 Organic EL display panel (display panel)
89 Organic EL display panel (display panel)

The invention claimed is:

1. A display panel, comprising:
a display region including a plurality of pixels that are arranged in a matrix, wherein
the plurality of pixels include central pixels arranged in a central region of the display region and one or more edge pixels arranged in an edge region of the display region,
each of the central pixels and the one or more edge pixels includes a first sub-pixel, a second-sub pixel, and a third sub-pixel which are arranged side by side in a row direction of the matrix,
each of the first sub-pixel, the second sub-pixel, and the third sub-pixel of the central pixels includes a central opening portion and a central light shielding portion surrounding the central opening portion,
each of the first sub-pixel, the second sub-pixel, and the third sub-pixel of the one or more edge pixels includes an edge opening portion and an edge light shielding portion surrounding the edge opening portion,
a length of the edge opening portion in a column direction of the matrix is shorter than a length of the central opening portion in the column direction, and a length of the edge opening portion in the row direction is shorter than a length of the central opening portion in the row direction,
each edge opening portion is divided in the column direction and the row direction by a corresponding edge light shielding portion of the first sub-pixel, the second sub-pixel, and the third sub-pixel in the one or more edge pixels,
each edge opening portion includes a plurality of sub opening portions,
a pair of the one or more edge pixels are arranged side by side in at least one row of the matrix, and
a number of the sub opening portions in each of the pair of the one or more edge pixels increases in the one or more edge pixels located farther from the central region toward the edge region.

2. The display according to claim 1, wherein each edge light shielding portion has a mesh shape.

3. The display according to claim 1, wherein an area of the edge opening portion of one of the pair of the one or more edge pixels that is closest to the central region is larger than an area of the edge opening portion of the other of the pair of the one or more edge pixels.

4. The display according to claim 1, wherein
the pair of the one or more edge pixels are arranged in a plurality of the rows of the matrix, and
a size of each edge opening portion of an outermost pixel of the pair of the one or more edge pixels in each of the plurality of rows is the same.

5. The display according to claim 1, wherein
the one or more edge pixels are further arranged in a plurality of rows of the matrix, and
an outer peripheral edge of the one or more edge pixels has a step shape.

6. The display according to claim 1, wherein the first sub-pixel, the second sub-pixel, and the third sub-pixel of the central pixels and the edge pixels each includes a liquid crystal layer.

7. A display panel, comprising:
a display region including a plurality of pixels that are arranged in a matrix, wherein
the plurality of pixels include central pixels arranged in a central region of the display region and one or more edge pixels arranged in an edge region of the display region,
each of the central pixels and the one or more edge pixels includes a first sub-pixel, a second-sub pixel, and a third sub-pixel which are arranged side by side in a row direction of the matrix,
each of the first sub-pixel, the second sub-pixel, and the third sub-pixel in the central pixels includes a central light emitting portion and a central non-light emitting portion surrounding the central light emitting portion,
each of the first sub-pixel, the second sub-pixel, and the third-pixel in the one or more edge pixels includes an edge light emitting portion and an edge non-light emitting portion surrounding the edge light emitting portion,
a length of the edge light emitting portion in a column direction of the matrix is shorter than a length of the central light emitting portion in the column direction, and a length of the edge light emitting portion in the row direction is shorter than a length of central light emitting portion in the row direction,
each edge light emitting portion is divided in the column direction and the row direction by the corresponding edge non-light emitting portion of the first sub-pixel, the second sub-pixel, and the third sub-pixel in the one or more edge pixels,
each edge light emitting portion includes a plurality of sub light emitting portions,
a pair of the one or more edge pixels are arranged side by side in at least one row of the matrix, and
a number of the sub light emitting portions in each of the pair of the one or more edge pixels increases in the one or more edge pixels located farther from the central region toward the edge region.

8. The display according to claim 7, wherein each edge non-light emitting portion has a mesh shape.

9. The display according to claim 7, wherein an area of the edge light emitting portion of one of the pair of the one or more edge pixels that is closest to the central region is larger than an area of the edge light emitting portion of the other of the pair of the one or more edge pixels.

10. The display according to claim 7, wherein
the pair of the one or more edge pixels are arranged in a plurality of the rows of the matrix, and
a size of each edge light emitting portion of an outermost pixel of the pair of the one or more edge pixels in each of the plurality of rows is the same.

11. The display according to claim 7, wherein
the one or more edge pixels are further arranged in a plurality of rows of the matrix, and
an outer peripheral edge of the one or more edge pixels has a step shape.

* * * * *